(12) United States Patent
Iwase et al.

(10) Patent No.: US 11,328,682 B2
(45) Date of Patent: May 10, 2022

(54) DISPLAY DEVICE CAPABLE OF HIGH-SPEED CHARGING/DISCHARGING AND SWITCHING SCANNING ORDER OF GATE BUS LINES

(71) Applicant: SHARP KABUSHIKI KAISHA, Sakai (JP)

(72) Inventors: Yasuaki Iwase, Sakai (JP); Takuya Watanabe, Sakai (JP); Akira Tagawa, Sakai (JP); Jun Nishimura, Sakai (JP); Yohei Takeuchi, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 17/226,864

(22) Filed: Apr. 9, 2021

(65) Prior Publication Data

US 2021/0327388 A1 Oct. 21, 2021

(30) Foreign Application Priority Data

Apr. 17, 2020 (JP) .............................. JP2020-073885

(51) Int. Cl.
*G09G 3/36* (2006.01)
*G11C 19/28* (2006.01)

(52) U.S. Cl.
CPC ......... *G09G 3/3677* (2013.01); *G09G 3/3696* (2013.01); *G09G 2310/0286* (2013.01);
(Continued)

(58) Field of Classification Search
CPC ...... G09G 3/36; G09G 3/3611; G09G 3/3622; G09G 3/3625; G09G 3/3677;
(Continued)

(56) References Cited

U.S. PATENT DOCUMENTS 10,825,414 B2 * 11/2020 Tanaka ................. G09G 3/3677
11,138,947 B2 * 10/2021 Iwase ................... G09G 3/3266
(Continued)

FOREIGN PATENT DOCUMENTS

JP  2014-071451 A  4/2014
JP  2019-074560 A  5/2019

OTHER PUBLICATIONS

Zhijun Wang et al., "Novel 1-to-N Architecture of Bidirectional Gate Driver for Ultra-Narrow-Border Display", SID 2018 Digest, 2018, pp. 1223-1226.
(Continued)

*Primary Examiner* — Alexander Eisen
*Assistant Examiner* — Nelson Lam
(74) *Attorney, Agent, or Firm* — ScienBiziP, P.C.

(57) ABSTRACT

A gate driver is constituted of a first gate driver including a first shift register that is configured by bistable circuits corresponding to gate bus lines on odd-numbered lines arranged on one side of a display portion, and a second gate driver including a second shift register that is configured by bistable circuits corresponding to gate bus lines on even-numbered lines arranged on another side of the display portion. A first buffer circuit is provided on one end side of each gate bus line, and a second buffer circuit is provided on another end side of each gate bus line. A control signal for controlling the scanning order of the gate bus line is given to the bistable circuit and the second buffer circuit.

16 Claims, 30 Drawing Sheets

(52) U.S. Cl.
CPC . *G09G 2310/0291* (2013.01); *G09G 2310/08* (2013.01); *G11C 19/28* (2013.01)

(58) Field of Classification Search
CPC .. G09G 3/3681; G09G 3/3685; G09G 3/3688; G09G 3/3692; G09G 2310/0291
USPC .................................................. 345/87–104
See application file for complete search history.

(56) References Cited

U.S. PATENT DOCUMENTS

| | | | |
|---|---|---|---|
| 11,151,956 B1* | 10/2021 | Iwase | G09G 3/3677 |
| 2011/0199354 A1* | 8/2011 | Iwase | G09G 3/3677 |
| | | | 345/208 |
| 2014/0035891 A1* | 2/2014 | Tanaka | G09G 3/20 |
| | | | 345/204 |
| 2014/0092082 A1 | 4/2014 | Choi | |
| 2014/0340600 A1* | 11/2014 | Yokonuma | G09G 3/3648 |
| | | | 349/33 |
| 2015/0138176 A1* | 5/2015 | Yokonuma | G09G 3/3648 |
| | | | 345/209 |
| 2019/0114984 A1 | 4/2019 | Tanaka et al. | |
| 2019/0279589 A1* | 9/2019 | Kusumi | G09G 3/3688 |
| 2020/0135132 A1* | 4/2020 | Tanaka | G09G 3/3688 |

OTHER PUBLICATIONS

Co-Pending letter regarding a related co-pending.

\* cited by examiner

DISPLAY DEVICE CAPABLE OF HIGH-SPEED CHARGING/DISCHARGING AND SWITCHING SCANNING ORDER OF GATE BUS LINES

CROSS-REFERENCE TO RELATED APPLICATIONS

This application claims the benefit of priority to Japanese Patent Application Number 2020-073885 filed on Apr. 17, 2020. The entire contents of the above-identified application are hereby incorporated by reference.

BACKGROUND

Technical Field

The following disclosure relates to a display device and more particularly relates to a scanning signal line drive circuit for driving scanning signal lines arranged in a display portion of the display device and a driving method of the scanning signal lines.

In the related art, a liquid crystal display device that includes a display portion including a plurality of source bus lines (data signal lines) and a plurality of gate bus lines (scanning signal lines) is known. In such a liquid crystal display device, a pixel forming section that forms a pixel is provided at each of intersections of the source bus lines and the gate bus lines. Each pixel forming section includes a thin film transistor (pixel TFT) that is a switching element with a gate terminal connected to a gate bus line passing through a corresponding intersection and a source terminal connected to a source bus line passing through the intersection, a pixel capacitance configured to hold a pixel voltage value, and the like. The liquid crystal display device also includes a gate driver (a scanning signal line drive circuit) for driving the gate bus lines and a source driver (a data signal line drive circuit) for driving the source bus lines.

A data signal indicating a pixel voltage value is transmitted through the source bus lines. However, each source bus line is incapable of transmitting data signals, which indicate pixel voltage values, for a plurality of lines at one time (at the same time). Thus, data signals are sequentially written (charged) line by line to the pixel capacitances in the plurality of pixel forming sections provided in the display portion. In order to achieve this, in each frame period, the gate driver sequentially selects the plurality of gate bus lines.

Incidentally, in such a liquid crystal display device, the gate driver has been mounted as an integrated circuit (IC) chip on a peripheral portion of a substrate constituting a liquid crystal panel in many cases. However, in recent years, more and more liquid crystal display devices have a configuration in which the gate driver is formed directly on a substrate. Such a gate driver is referred to as a "monolithic gate driver" or the like.

As the monolithic gate driver, a monolithic gate driver including a first gate driver and a second gate driver arranged so as to face each other with a display portion interposed therebetween is known. As a method for providing a scanning signal from a gate driver to gate bus lines in such a configuration, a two-sided input method in which the scanning signals are applied to both ends of each gate bus line as illustrated in FIG. 26, and a one-sided input method in which the scanning signals are alternately applied to one end and another end of the gate bus lines, respectively in the display portion (for example, a method in which the scanning signals are applied from a first gate driver to gate bus lines on the odd-numbered lines and the scanning signals are applied from a second gate driver to gate bus lines on the even-numbered lines) as illustrated in FIG. 27 are known. Note that constituent elements denoted by reference signs UC1 to UC4 in FIGS. 26 and 27 are unit circuits described later. A liquid crystal display device that employs the one-sided input method as illustrated in FIG. 27 is disclosed in, for example, JP 2014-71451 A.

Commonly, a gate driver has a configuration in which a plurality of unit circuits each including one bistable circuit are cascade-connected. Each unit circuit is connected to one of the plurality of gate bus lines, and applies a scanning signal to the connected gate bus line. In the one-sided input method illustrated in FIG. 27, the unit circuits in the first gate driver are connected to the gate bus lines on the odd-numbered lines, and the unit circuits in the second gate driver are connected to the gate bus lines on the even-numbered lines. In other words, the unit circuits connected to the plurality of gate bus lines are alternately arranged on one end side and the other end side of the plurality of gate bus lines. Thus, the gate driver adopting the one-sided input method as illustrated in FIG. 27 is referred to as a gate driver adopting an "interlaced arrangement method".

FIG. 28 is a schematic circuit diagram illustrating a configuration of a first gate driver 900 in a case in which the two-sided input method is employed. The first gate driver 900 includes a shift register 901 and an output buffer unit 902, and operates based on a four-phase clock signal constituted of first to fourth gate clock signals GCK1 to GCK4. The configuration of a second gate driver is the same as the configuration of the first gate driver 900. Hereinafter, it is assumed that i gate bus lines are arranged in the display portion.

The shift register 901 includes i bistable circuits SR(1) to SR(i) cascade-connected to each other, and is configured to sequentially transfer a start pulse from the first stage bistable circuit SR(1) to the final stage bistable circuit SR(i) based on the first to fourth gate clock signals GCK1 to GCK4. The output buffer unit 902 includes i buffer circuits Buff(1) to Buff(i) corresponding to the i bistable circuits SR(1) to SR(i) constituting the shift register 901, respectively. The first to fourth gate clock signals GCK1 to GCK4 cyclically correspond to the i buffer circuits Buff(1) to Buff(i). The i gate bus lines GL(1) to GL(i) are connected to the output ends of i buffer circuits Buff(1) to Buff(i), respectively. Each buffer circuit Buff receives the output signal of the corresponding bistable circuit SR and the corresponding gate clock signal GCK, and generates a scanning signal to be applied to the gate bus line GL from these signals. For example, the nth buffer circuit Buff(n) generates the scanning signal from the output signal of the bistable circuit SR(n) on the nth stage and the first gate clock signal GCK1, and applies the scanning signal to the gate bus line GL(n) on the nth line.

FIG. 29 is a circuit diagram illustrating a configuration of a circuit corresponding to one gate bus line GL (unit circuit) in the first gate driver 900. Note that the unit circuit illustrated in FIG. 29 is assumed to be a unit circuit corresponding to the gate bus line GL(n) on the nth line. This unit circuit is constituted of a bistable circuit SR(n) on the nth stage in the shift register 901 and the nth buffer circuit Buff(n) in the output buffer unit 902.

Note that, in this specification, an example in which an N-channel thin film transistor (TFT) is used will be described. With regard to this, in N-channel transistors, of a drain and a source, the one having a higher potential is referred to as the drain, but in the description of this specification, one is defined as the drain and another is defined as the source, so that the source potential may be higher than the drain potential in some cases.

As illustrated in FIG. 29, the bistable circuit SR(n) includes two N-channel thin film transistors TA1 and TA2. A drain terminal of the thin film transistor TA1 is connected to a high level power supply line VDD, a source terminal of the thin film transistor TA2 is connected to a low level power supply line VSS, and a source terminal of the thin film transistor TA1 and a drain terminal of the thin film transistor TA2 are connected to each other to form an output end. Hereinafter, a node including this output end is referred to as a "state node". A gate terminal of the thin film transistor TA1 corresponds to a set terminal S, and a gate terminal of the thin film transistor TA2 corresponds to a reset terminal R. The bistable circuit SR(n) is put into one of two states by charging or discharging the electric charge to a capacitance (a boost capacitor Cbst, described later, constituted of a gate capacitance of the thin film transistor TB and the like in the buffer circuit Buff(n)) that is connected to a state node NA(n). In other words, when an active signal (high level signal) is given to the set terminal S, which is the gate terminal of the thin film transistor TA1, the bistable circuit SR(n) is in a set state (a state in which the voltage of the state node NA(n) is at a high level), and when an active signal (high level signal) is given to the reset terminal R, which is the gate terminal of the thin film transistor TA2, the bistable circuit SR(n) is in a reset state (a state in which the voltage of the state node NA(n) is at a low level). For the bistable circuit SR(n) illustrated in FIG. 29, the set terminal S is connected to the gate bus line GL(n−2) on the (n−2)th line, and the reset terminal R is connected to the gate bus line GL(n+3) on the (n+3)th line. Note that when the bistable circuit SR(n) is in the set state, the active signal is outputted from the output end. The active signal here is the high level signal (also includes a signal whose level is higher than a normal high level due to the boost operation described later).

As illustrated in FIG. 29, the buffer circuit Buff(n) includes a buffer transistor TB, which is an N-channel thin film transistor, and the boost capacitor Cbst. The first gate clock signal GCK1, which is the gate clock signal corresponding to the buffer circuit Buff(n), is given to a drain terminal of the buffer transistor TB. A gate terminal of the buffer transistor TB corresponds to an input end of the buffer circuit Buff(n), and is connected to the state node NA(n). A source terminal of the buffer transistor TB corresponds to an output end of the buffer circuit Buff(n), is connected to the gate terminal of the buffer transistor TB via the boost capacitor Cbst, and is also connected to the gate bus line GL(n) on the nth line.

Next, a configuration of the gate driver adopting the interlaced arrangement method will be described. FIG. 30 is a schematic circuit diagram illustrating a configuration of a gate driver adopting the interlaced arrangement method constituted of a first gate driver 910 and a second gate driver 920 arranged on one end side and another end side of the gate bus lines GL(1) to GL(i), respectively. In a liquid crystal display device in which such a gate driver adopting the interlaced arrangement method is used, the gate bus lines GL connected to the first gate driver 910 and the gate bus lines GL connected to the second gate driver 920 are alternately arranged in the display portion.

The gate driver adopting the interlaced arrangement method also operates based on the four-phase clock signal constituted of the first to fourth gate clock signals GCK1 to GCK4. Note that the first gate driver 910 operates based on the first and third gate clock signals GCK1 and GCK3, and the second gate driver 920 operates based on the second and fourth gate clock signals GCK2 and GCK4. The first gate driver 910 includes a first shift register 911 and a first output buffer unit 912. The first shift register 911 has a configuration in which the bistable circuits ( . . . , SR(n−2), SR(n), SR(n+2), . . . ) selected alternately from the i bistable circuits SR(1) to SR(i) in the shift register 901 in the first gate driver 900 illustrated in FIG. 28 are cascade-connected. The first output buffer unit 912 includes the buffer circuits ( . . . , Buff(n−2), Buff(n), Buff(n+2), . . . ) that correspond to the bistable circuits ( . . . , SR(n−2), SR(n), SR(n+2), . . . ), respectively. Each of the buffer circuits Buff in the first output buffer unit 912 generates a scanning signal to be applied to the gate bus line GL based on the output signal of the corresponding bistable circuit SR and either the first gate clock signal GCK1 or the third gate clock signal GCK3. On the other hand, the second gate driver 920 includes a second shift register 921 and a second output buffer unit 922. The second shift register 921 has a configuration in which the bistable circuits ( . . . , SR(n− 1), SR(n+1), SR(n+3), . . . ) that are not included in the first shift register 911 among the i bistable circuits SR(1) to SR(i) are cascade-connected. The second output buffer unit 922 includes the buffer circuits ( . . . , Buff(n− 1), Buff(n+1), Buff(n+3), . . . ) that correspond to the bistable circuits ( . . . , SR(n− 1), SR(n+1), SR(n+3), . . . ), respectively. Each of the buffer circuits Buff in the second output buffer unit 922 generates a scanning signal to be applied to the gate bus line GL based on the output signal of the corresponding bistable circuit SR and either the second gate clock signal GCK2 or the fourth gate clock signal GCK4.

According to the gate driver adopting the interlaced arrangement method, since the scanning signal is applied to each of the gate bus lines GL arranged in the display portion from only one side, the area occupied by each of the first gate driver 910 and the second gate driver 920 is reduced, which makes it possible to achieve the frame narrowing in the display device. In addition, according to a liquid crystal display device disclosed in JP 2014-071451 A, a plurality of stages (unit circuits) configuring a gate drive unit are arranged to be interlaced, and for each gate bus line, one end is connected to the stage in the first or second gate drive unit, and another end is connected to a discharge circuit (discharge transistor). According to such a configuration, the frame narrowing can be achieved, and the discharge circuit (discharge transistor) that assists the discharge of the gate bus line is provided, so that the discharge delay of the gate drive voltage is prevented (see paragraph 0042, 0065 to 0066 of the same publication).

However, in the liquid crystal display device disclosed in JP 2014-071451 A, the discharge transistor that assists the discharge of the gate bus line starts the shift from an off state to an on state after the start of the discharge of the gate bus line, so that the discharge cannot be performed at a sufficiently high speed. Additionally, in the gate driver adopting the interlaced arrangement method, the scanning signal is given to each gate bus line only from one end portion thereof, so that the waveform of the scanning signal is blunt at another end portion, and the speed of charging the pixel capacitance decreases. Therefore, when the size of the display panel is large, it is difficult to display a good image using the gate driver adopting the interlaced arrangement method.

On the other hand, JP 2019-074560 A discloses a liquid crystal display device that achieves frame narrowing and rapid charging/discharging of a gate bus line. In the sections of the seventh and eighth embodiments of the same publication, configurations are described in which a plurality of buffer circuits are associated with one bistable circuit in order to achieve the frame narrowing. Note that the configuration of associating the plurality of buffer circuits with one bistable circuit is also described in "Novel 1-to-N Architecture of Bidirectional Gate Driver for Ultra-Narrow-Border Display" of SID 2018 DIGEST.

SUMMARY

Incidentally, some display devices in recent years are capable of switching the shift direction in the shift register in the gate driver (that is, switching the scanning order of a plurality of gate bus lines). However, the liquid crystal display device described in JP 2019-074560 A cannot switch the shift direction. Further, according to the configuration described in "Novel 1-to-N Architecture of Bidirectional Gate Driver for Ultra-Narrow-Border Display" of SID 2018 DIGEST, the shift direction can be switched, but the effect of the frame narrowing is small because the "inter-stage transfer unit" corresponding to the bistable circuit includes as many as 11 thin film transistors.

Therefore, it is desirable to achieve a display device capable of high-speed charging/discharging of the gate bus lines and switching a scanning order of the gate bus lines, and capable of the frame narrowing.

(1) A scanning signal line drive circuit according to some embodiments of the disclosure is a scanning signal line drive circuit configured to sequentially apply an on level scanning signal to a plurality of scanning signal lines arranged in a display portion of a display device, the scanning signal line drive circuit includes a first scanning signal line drive unit arranged on one end side of the plurality of scanning signal lines and configured to operate based on a multi-phase clock signal, a second scanning signal line drive unit arranged on another end side of the plurality of scanning signal lines and configured to operate based on the multi-phase clock signal, a first control line configured to supply a voltage corresponding to an on level in a case that the on level scanning signal is applied to the plurality of scanning signal lines in ascending order and supply a voltage corresponding to an off level in a case that the on level scanning signal is applied to the plurality of scanning signal lines in descending order, and a second control line configured to supply the voltage corresponding to the off level in a case that the on level scanning signal is applied to the plurality of scanning signal lines in ascending order and supply the voltage corresponding to the on level in a case that the on level scanning signal is applied to the plurality of scanning signal lines in descending order, in which each of the first scanning signal line drive unit and the second scanning signal line drive unit includes a shift register including a plurality of bistable circuits cascade-connected to each other, a plurality of first buffer circuits having one-to-one correspondence with the plurality of bistable circuits and connected to the plurality of scanning signal lines every other line, respectively, and a plurality of second buffer circuits connected to the plurality of scanning signal lines not connected to the plurality of first buffer circuits, respectively, the plurality of bistable circuits constituting the shift register included in the first scanning signal line drive unit have one-to-one correspondence with the plurality of scanning signal lines on odd-numbered lines, each of the plurality of first buffer circuits included in the first scanning signal line drive unit is connected to the scanning signal line on the odd-numbered line, each of the plurality of second buffer circuits included in the first scanning signal line drive unit is connected to the scanning signal line on an even-numbered line, the plurality of bistable circuits constituting the shift register included in the second scanning signal line drive unit have one-to-one correspondence with the plurality of scanning signal lines on the even-numbered lines, each of the plurality of first buffer circuits included in the second scanning signal line drive unit is connected to the scanning signal line on the even-numbered line, each of the plurality of second buffer circuits included in the second scanning signal line drive unit is connected to the scanning signal line on the odd-numbered line, each of the plurality of first buffer circuits applies the on level scanning signal to the scanning signal line to be connected, based on an output signal of the bistable circuit corresponding to the scanning signal line to be connected and the clock signal to be supplied, each of the plurality of second buffer circuits applies the on level scanning signal to the scanning signal line to be connected, based on the output signal of the bistable circuit corresponding to one scanning signal line adjacent to the scanning signal line to be connected, the output signal of the bistable circuit corresponding to another scanning signal line adjacent to the scanning signal line to be connected, and the clock signal to be supplied, with I as an integer, to the first buffer circuit connected to the scanning signal line on an Ith line, the second buffer circuit connected to the scanning signal line on an (I−1)th line, and the second buffer circuit connected to the scanning signal line on an (I+1)th line, the identical output signal of the bistable circuit is supplied and also the clock signals having different phases from each other in the multi-phase clock signal are supplied, the identical clock signal in the multi-phase clock signal is supplied to the first buffer circuit and the second buffer circuit, connected to the identical scanning signal line, with J and K as integers, the bistable circuit corresponding to the scanning signal line on a Kth line includes a first state node connected to the first buffer circuit to which the output signal is outputted, a first first state node control transistor including a control terminal connected to the scanning signal line on a (K−J)th line or a control terminal to which a signal having a waveform having a phase identical with the scanning signal applied to the scanning signal line on the (K−J)th line is given, a first conduction terminal connected to the first control line, and a second conduction terminal connected to the first state node, and a second first state node control transistor including a control terminal connected to the scanning signal line on a (K+J)th line or a control terminal to which a signal having a waveform having a phase identical with the scanning signal applied to the scanning signal line on the (K+J)th line is given, a first conduction terminal connected to the second control line, and a second conduction terminal connected to the first state node.

(2) The scanning signal line drive circuit according to some embodiments of the disclosure includes the configuration of (1), in which J is an integer of two or more, the number of phases of the multi-phase clock signal is (J+2) or more, and a pulse width of the multi-phase clock signal corresponds to a length of one horizontal scanning period or more and (J−1) horizontal scanning period or less.

(3) The scanning signal line drive circuit according to some embodiments of the disclosure includes the configuration of (1), in which each of the plurality of first buffer circuits includes a first buffer transistor including a control terminal connected to the first state node included in the corresponding bistable circuit, a first conduction terminal to which the corresponding clock signal is given, and a second conduction terminal connected to the corresponding scanning signal line, and a first capacitor whose one end is connected to the control terminal of the first buffer transistor and another end is connected to the second conduction terminal of the first buffer transistor.

(4) The scanning signal line drive circuit according to some embodiments of the disclosure includes the configuration of (1), in which each of the plurality of second buffer circuits includes a second state node, a second buffer transistor including a control terminal connected to the second state node, a first conduction terminal to which the corresponding clock signal is given, and a second conduction terminal connected to the corresponding scanning signal line, a first control transistor including a control terminal connected to the second control line, a first conduction terminal connected to the first state node included in the bistable circuit corresponding to the one scanning signal line adjacent to the scanning signal line to be connected, and a second conduction terminal connected to the second state node, a second control transistor including a control terminal connected to the first control line, a first conduction terminal connected to the first state node included in the bistable circuit corresponding to the other scanning signal line adjacent to the scanning signal line to be connected, and a second conduction terminal connected to the second state node, and a second capacitor whose one end is connected to the control terminal of the second buffer transistor and another end is connected to the second conduction terminal of the second buffer transistor.

(5) The scanning signal line drive circuit according to some embodiments of the disclosure includes the configuration of (1), in which each of the plurality of first buffer circuits includes a first buffer transistor including a control terminal connected to the first state node included in the corresponding bistable circuit, a first conduction terminal to which the corresponding clock signal is given, and a second conduction terminal connected to the corresponding scanning signal line, and a first capacitor whose one end is connected to the control terminal of the first buffer transistor and another end is connected to the second conduction terminal of the first buffer transistor, each of the plurality of second buffer circuits includes a second state node, a second buffer transistor including a control terminal connected to the second state node, a first conduction terminal to which the corresponding clock signal is given, and a second conduction terminal connected to the corresponding scanning signal line, a first control transistor including a control terminal connected to the second control line, a first conduction terminal connected to the first state node included in the bistable circuit corresponding to the one scanning signal line adjacent to the scanning signal line to be connected, and a second conduction terminal connected to the second state node, a second control transistor including a control terminal connected to the first control line, a first conduction terminal connected to the first state node included in the bistable circuit corresponding to the other scanning signal line adjacent to the scanning signal line to be connected, and a second conduction terminal connected to the second state node, and a second capacitor whose one end is connected to the control terminal of the second buffer transistor and another end is connected to the second conduction terminal of the second buffer transistor, sizes for the first buffer transistor and the second buffer transistor, which are different from each other, and capacitance values for the first capacitor and the second capacitor, which are different from each other, are configured to make drive capability of the scanning signal line by the first buffer circuit be about identical with drive capability of the scanning signal line by the second buffer circuit.

(6) A display device according to some embodiments of the disclosure is a display device including a display portion provided with a plurality of data signal lines, a plurality of scanning signal lines intersecting the plurality of data signal lines, and a plurality of pixel forming sections arranged in a matrix along the plurality of data signal lines and the plurality of scanning signal lines, the display device includes a data signal line drive circuit configured to drive the plurality of data signal lines, the scanning signal line drive circuit including any of the configurations of (1) to (5), and a display control circuit configured to control the data signal line drive circuit and the scanning signal line drive circuit.

(7) The display device according to some embodiments of the disclosure includes the configuration of (6), in which the scanning signal line drive circuit and the display portion are integrally formed on an identical substrate.

(8) A driving method (of scanning signal lines) according to some embodiments of the disclosure is a driving method of a plurality of scanning signal lines arranged in a display portion of a display device, in which the display device includes a first scanning signal line drive unit arranged on one end side of the plurality of scanning signal lines and configured to operate based on a multi-phase clock signal, a second scanning signal line drive unit arranged on another end side of the plurality of scanning signal lines and configured to operate based on the multi-phase clock signal, a first control line configured to supply a voltage corresponding to an on level in a case that the on level scanning signal is applied to the plurality of scanning signal lines in ascending order and supply a voltage corresponding to an off level in a case that the on level scanning signal is applied to the plurality of scanning signal lines in descending order, and a second control line configured to supply the voltage corresponding to the off level in a case that the on level scanning signal is applied to the plurality of scanning signal lines in ascending order and supply the voltage corresponding to the on level in a case that the on level scanning signal is applied to the plurality of scanning signal lines in descending order, each of the first scanning signal line drive unit and the second scanning signal line drive unit includes a shift register including a plurality of bistable circuits cascade-connected to each other, a plurality of first buffer circuits having one-to-one correspondence with the plurality of bistable circuits and connected to the plurality of scanning signal lines every other line, respectively, and a plurality of second buffer circuits connected to the plurality of scanning signal lines not connected to the plurality of first buffer circuits, respectively, the plurality of bistable circuits constituting the shift register included in the first scanning signal line drive unit have one-to-one correspondence with the plurality of scanning signal lines on odd-numbered lines, each of the plurality of first buffer circuits included in the first scanning signal line drive unit is connected to the scanning signal line on the odd-numbered line, each of the plurality of second buffer circuits included in the first scanning signal line drive unit is connected to the scanning signal line on an even-numbered line, the plurality of bistable circuits constituting the shift register included in the second scanning signal line drive unit have one-to-one correspondence with the plurality of scanning signal lines on the even-numbered lines, each of the plurality of first buffer circuits included in the second scanning signal line drive unit is connected to the scanning signal line on the even-numbered line, each of the plurality of second buffer circuits included in the second scanning signal line drive unit is connected to the scanning signal line on the odd-numbered line, each of the plurality of first buffer circuits applies the on level scanning signal to the scanning signal line to be connected, based on an output signal of the bistable circuit corresponding to the scanning signal line to be connected and the clock signal to be supplied, each of the plurality of second buffer circuits applies the on level scanning signal to the scanning signal line to be connected, based on the output signal of the bistable circuit corresponding to one scanning signal line adjacent to the scanning signal line to be connected, the output signal of the bistable circuit corresponding to another scanning signal line adjacent to the scanning signal line to be connected, and the clock signal to be supplied, with I as an integer, to the first buffer circuit connected to the scanning signal line on an Ith line, the second buffer circuit connected to the scanning signal line on an (I−1)th line, and the second buffer circuit connected to the scanning signal line on an (I+1)th line, the identical output signal of the bistable circuit is supplied and also the clock signals having different phases from each other in the multi-phase clock signal are supplied, the identical clock signal in the multi-phase clock signal is supplied to the first buffer circuit and the second buffer circuit, connected to the identical scanning signal line, with J and K as integers, the bistable circuit corresponding to the scanning signal line on a Kth line includes a first state node connected to the first buffer circuit to which the output signal is outputted, a first first state node control transistor including a control terminal connected to the scanning signal line on a (K−J)th line or a control terminal to which a signal having a waveform having a phase identical with the scanning signal applied to the scanning signal line on the (K−J)th line is given, a first conduction terminal connected to the first control line, and a second conduction terminal connected to the first state node, and a second first state node control transistor including a control terminal connected to the scanning signal line on a (K+J)th line or a control terminal to which a signal having a waveform having a phase identical with the scanning signal applied to the scanning signal line on the (K+J)th line is given, a first conduction terminal connected to the second control line, and a second conduction terminal connected to the first state node, in a case that the on level scanning signal is applied to the plurality of scanning signal lines in ascending order, a start pulse is given to the bistable circuit on a first stage side for the shift register, in a case that the on level scanning signal is applied to the plurality of scanning signal lines in descending order, the start pulse is given to the bistable circuit on a final stage side for the shift register, and for the multi-phase clock signal, clock pulse generation order in a case that the on level scanning signal is applied to the plurality of scanning signal lines in ascending order is reversed to the clock pulse generation order in a case that the on level scanning signal is applied to the plurality of scanning signal lines in descending order, the driving method includes a first first state node control transistor turn-on step in which the first first state node control transistor is changed from the off state to the on state, a first first state node control transistor turn-off step in which the first first state node control transistor is changed from the on state to the off state, a second first state node control transistor turn-on step, in which the second first state node control transistor is changed from the off state to the on state, and a second first state node control transistor turn-off step in which the second first state node control transistor is changed from the on state to the off state, in which in a case that the on level scanning signal is applied to the plurality of scanning signal lines in ascending order, processing is performed in order of the first first state node control transistor turn-on step, the first first state node control transistor turn-off step, the second first state node control transistor turn-on step, and the second first state node control transistor turn-off step, and in a case that the on level scanning signal is applied to the plurality of scanning signal lines in descending order, processing is performed in order of the second first state node control transistor turn-on step, the second first state node control transistor turn-off step, the first first state node control transistor turn-on step, and the first first state node control transistor turn-off step.

According to the scanning signal line drive circuit according to some embodiments of the disclosure, each of the scanning signal lines arranged in the display portion of the display device is driven by the first scanning signal line drive unit and the second scanning signal line drive unit. In other words, the on level or the off level voltages are applied to each of the scanning signal lines from the both ends thereof as the scanning signals. Consequently, each of the scanning signal lines can be charged and discharged at high speed, so that even the large-sized display portion can satisfactorily display an image by driving at high speed. Here, the shift register in the first scanning signal line drive unit is constituted of the bistable circuits corresponding to the scanning signal lines on the odd-numbered lines, and the shift register in the second scanning signal line drive unit is constituted of the bistable circuits corresponding to the scanning signal lines on the even-numbered lines. Then, the operation of the two buffer circuits (first and second buffer circuits) is controlled by the output signal of each of the bistable circuits. With the configuration described above, the area required for achieving the shift register can be reduced, and the frame narrowing can be achieved. Further, with J and K as integers, the bistable circuit corresponding to the scanning signal line on the Kth line includes the first state node connected to the first buffer circuit to which the output signal is outputted, the first first state node control transistor having the control terminal connected to the scanning signal line on the (K−J)th line, the first conduction terminal connected to the first control line, and the second conduction terminal connected to the first state node, and the second first state node control transistor having the control terminal connected to the scanning signal line on the (K+J)th line, the first conduction terminal connected to the second control line, and the second conduction terminal connected to the first state node. Here, when the on level scanning signal is applied to the plurality of scanning signal lines in ascending order, the voltage corresponding to the on level is applied to the first control line and the voltage corresponding to the off level is applied to the second control line, and when the on level scanning signal is applied to the plurality of scanning signal lines in descending order, the voltage corresponding to the off level is applied to the first control line and the voltage corresponding to the on level is applied to the second control line. Further, the second buffer circuit is configured to apply the on level scanning signal to the scanning signal line to be connected, based on the output signal of the bistable circuit corresponding to the one scanning signal line adjacent to the scanning signal line to be connected, the output signal of the bistable circuit corresponding to the other scanning signal line adjacent to the scanning signal line to be connected, and the clock signal. With the configuration described above, when the start pulse is applied to the bistable circuit on the first stage side of the shift register, the forward scanning is performed, and when the start pulse is applied to the bistable circuit on the final stage side of the shift register, the reverse scanning is performed. In this manner, it is possible to switch the scanning order of the scanning signal lines. As described above, a display device capable of high speed charging/discharging of the scanning signal lines and switching scanning order of the scanning signal lines and the frame narrowing can be achieved.

BRIEF DESCRIPTION OF DRAWINGS

The disclosure will be described with reference to the accompanying drawings, wherein like numbers reference like elements.

DESCRIPTION OF EMBODIMENTS

An embodiment will be described below with reference to the accompanying drawings. Note that regarding each transistor referred to below, a gate terminal corresponds to a control terminal, one of a drain terminal and a source terminal corresponds to a first conduction terminal, and another corresponds to a second conduction terminal. Further, it is assumed that all transistors according to the present embodiment are N-channel thin film transistors, but the disclosure is not limited to this.

1. Overall Configuration and Operation Outline

Figure 2:
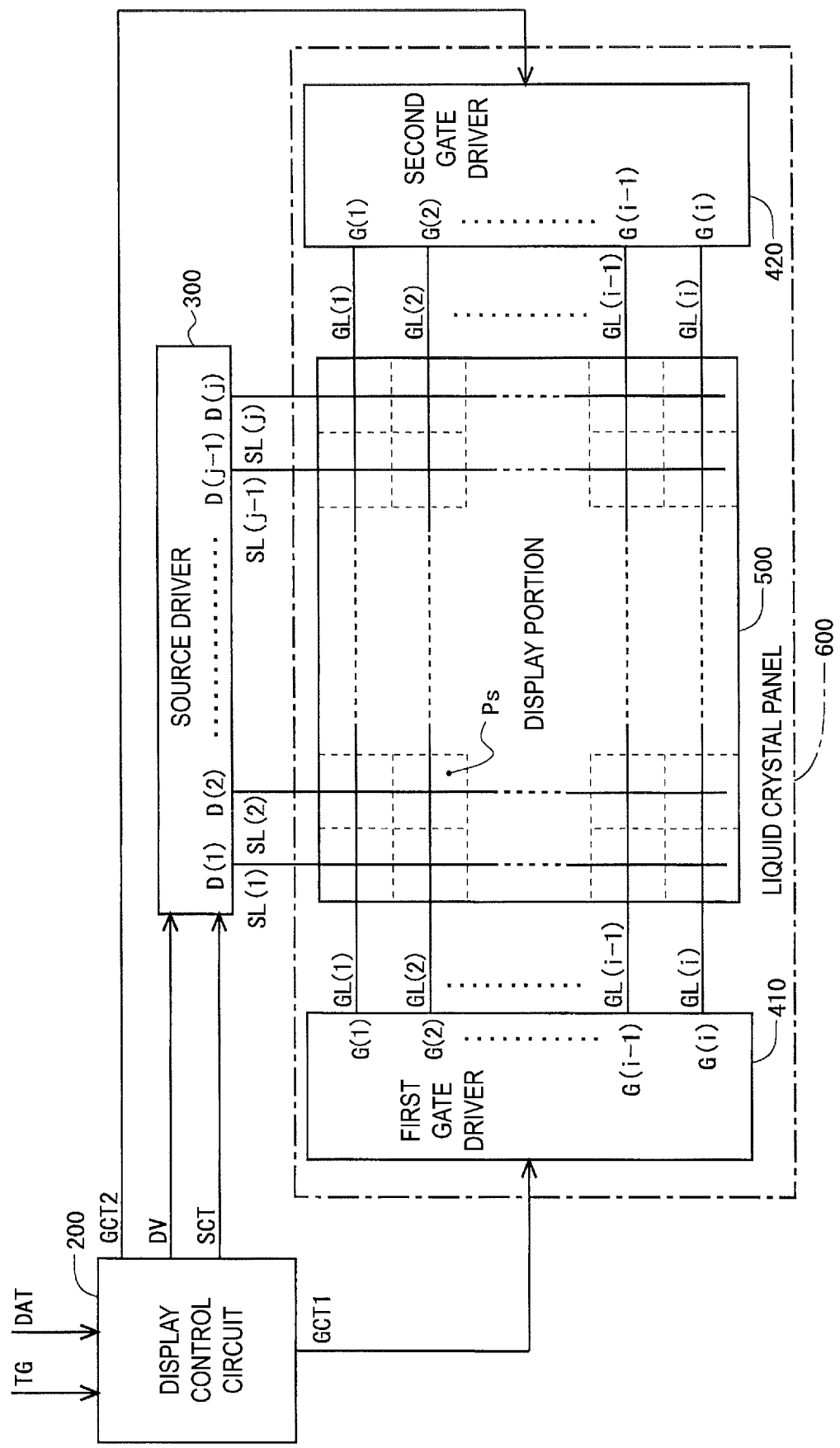
FIG. 2 is a block diagram illustrating an overall configuration of an active matrix liquid crystal display device according to the embodiment.

FIG. 2 is a block diagram illustrating an overall configuration of an active matrix liquid crystal display device according to the embodiment. The liquid crystal display device includes a display control circuit 200, a source driver (data signal line drive circuit) 300, and a liquid crystal panel 600. The liquid crystal panel 600 includes a gate driver (scanning signal line drive circuit) constituted of a first gate driver 410 and a second gate driver 420, and a display portion 500. As illustrated in FIG. 2, the first gate driver 410 and the second gate driver 420 are arranged so as to face each other with the display portion 500 interposed therebetween. In the present embodiment, a pixel circuit included in the display portion 500 and the gate driver are integrally formed on a substrate (active matrix substrate) of the two substrates constituting the liquid crystal panel 600. Note that the first scanning signal line drive unit is achieved by the first gate driver 410, and the second scanning signal line drive unit is achieved by the second gate driver 420.

The display portion 500 is provided with a plurality (j) of source bus lines SL(1) to SL(j) as data signal lines, a plurality (i) of gate bus lines GL(1) to GL(i) as scanning signal lines that intersect the plurality of source bus lines SL(1) to SL(j), and a plurality (i×j) of pixel forming sections Ps arranged in a matrix along the plurality of source bus lines SL(1) to SL(j) and the plurality of gate bus lines GL(1)

to GL(i). Each of pixel forming sections Ps corresponds to one of the plurality of source bus lines SL(1) to SL(j), and corresponds to one of the plurality of gate bus lines GL(1) to GL(i). Note that a method adopted in the liquid crystal panel 600 is not limited to a vertical alignment (VA) method, a twisted nematic (TN) method, and the like in which the electric field is applied in the direction perpendicular to the liquid crystal layer, and may be an in-plane switching (IPS) method in which the electric field is applied in the direction substantially parallel to the liquid crystal layer.

Incidentally, in the liquid crystal display device according to the present embodiment, it is possible to switch the shift direction in the shift register (switch the scanning order of the plurality of gate bus lines GL) in the gate driver. In this regard, in the following description, scanning of the gate bus lines GL in the order of "1st line, 2nd line, . . . , (i−1)th line, and ith line" is referred to as "forward scanning," and scanning of the gate bus lines GL in the order of "ith line, (i−1)th line, . . . , 2nd line, and 1st line" is referred to as "reverse scanning".

Figure 3:
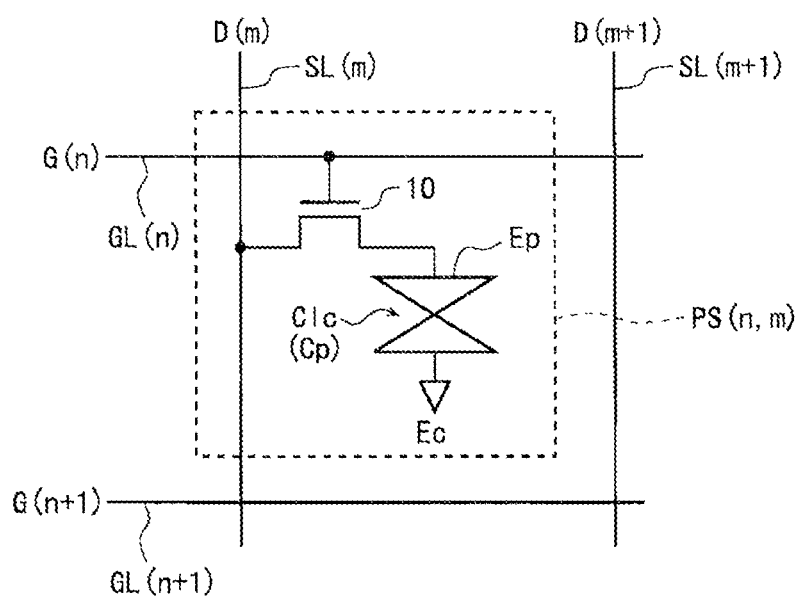
FIG. 3 is a circuit diagram illustrating an electrical configuration of one pixel forming section in a display portion according to the embodiment.

FIG. 3 is a circuit diagram illustrating an electrical configuration of one pixel forming section Ps (n, m) in the display portion 500. As illustrated in FIG. 3, the pixel forming section Ps(n, m) includes a thin film transistor 10 in which a gate terminal connected to a gate bus line GL(n) passing through a corresponding intersection and a source terminal connected to a source bus line SL(m) passing through the intersection, a pixel electrode Ep connected to a drain terminal of the thin film transistor 10, a common electrode Ec that is a counter electrode commonly provided for the plurality of pixel forming sections Ps, and a liquid crystal layer commonly provided for the plurality of pixel forming sections Ps and sandwiched between the pixel electrode Ep and the common electrode Ec. Further, a pixel capacitance Cp is configured by a liquid crystal capacitance Clc formed by the pixel electrode Ep and the common electrode Ec. Note that, although an auxiliary capacity is normally provided in parallel with the liquid crystal capacitance Clc in order to reliably hold the electric charge in the pixel capacitance Cp, since the auxiliary capacity is not directly related to the disclosure, the description and illustration thereof will be omitted. When the liquid crystal panel 600 adopts the IPS method, the common electrode Ec is formed on the one substrate (active matrix substrate) of the two substrates constituting the liquid crystal panel 600. When the liquid crystal panel 600 adopts the VA method or the like, the common electrode Ec is formed on the other substrate of the two substrates constituting the liquid crystal panel 600.

As the thin film transistor 10 in the pixel forming section Ps, a thin film transistor using amorphous silicon for the channel layer (a-Si TFT), a thin film transistor using microcrystalline silicon for the channel layer, a thin film transistor using an oxide semiconductor for the channel layer (oxide TFT), a thin film transistor using low-temperature polysilicon for the channel layer (LTPS-TFT), and the like can be employed. As the oxide TFT, for example, a thin film transistor having an oxide semiconductor layer including an In—Ga—Zn—O based semiconductor (for example, indium gallium zinc oxide) can be employed. The same applies to the thin film transistors in the first gate driver 410 and the second gate driver 420 in these points.

The display control circuit unit 200 receives an image signal DAT and a timing control signal TG given from the outside, and outputs a digital image signal DV, a source control signal SCT for controlling the operation of the source driver 300, a first gate control signal GCT1 for controlling the operation of the first gate driver 410, and a second gate control signal GCT2 for controlling the operation of the second gate driver 420. The source control signal SCT includes a source start pulse signal, a source clock signal, and a latch strobe signal. The first gate control signal GCT1 includes a gate start pulse signal for forward scanning, a gate start pulse signal for reverse scanning, first to sixth gate clock signals GCK1 to GCK6, which are different in phase from each other, and signals for controlling the shift direction (first and second shift direction control signals UDa and UDb, which are described later). The second gate control signal GCT2 is similar to the first gate control signal GCT1.

The source driver 300 applies data signals D(1) to D(j) to the source bus lines SL(1) to SL(j), respectively, based on the digital image signal DV and the source control signal SCT sent from the display control circuit 200. At this time, the source driver 300 sequentially holds the digital image signals DV indicating respective voltages to be applied to the corresponding source bus lines SL at timings when pulses of the source clock signal are generated. At a timing when a pulse of the latch strobe signal is generated, the held digital image signals DV are converted into analog voltages. Such converted analog voltages are simultaneously applied to all the source bus lines SL(1) to SL(j) as data signals D(1) to D(j).

The first gate driver 410 is arranged on one end side of the gate bus lines GL(1) to GL(i), and applies scanning signals G(1) to G(i) to the one end side of the gate bus lines GL(1) to GL(i), respectively, based on the first gate control signal GCT1 sent from the display control circuit 200. On the other hand, the second gate driver 420 is arranged on the other end side of the gate bus lines GL(1) to GL(i), and applies the scanning signals G(1) to G(i) to the other end side of the gate bus lines GL(1) to GL(i), respectively, based on the second gate control signal GCT2 sent from the display control circuit 200. Consequently, in each frame period, the active scanning signal is sequentially applied from both ends to the gate bus lines GL(1) to GL(i). Such application of the active scanning signal to the gate bus lines GL(1) to GL(i) is repeated with a cycle of one frame period (one vertical scan period).

As described above, the data signals D(1) to D(j) are applied to the source bus lines SL(1) to SL(j), and the scanning signals G(1) to G(i) are applied to the gate bus lines GL(1) to GL(i). Consequently, the pixel data based on the digital image signal DV is written in each of the pixel forming sections Ps.

In addition, a backlight unit (not illustrated) is provided on the back face side of the liquid crystal panel 600. With this, backlight is irradiated to the back face of the liquid crystal panel 600. The backlight unit is also driven by the display control circuit 200, but may be configured to be driven by another method. Note that when the liquid crystal panel 600 is a reflective type, the backlight unit is not necessary.

As described above, the pixel data based on the digital image signal DV is written to each of the pixel forming sections Ps, and the backlight is irradiated to the back face of the liquid crystal panel 600, so that an image represented by the image signal DAT given from the outside is displayed on the display portion 500.

2. Gate Driver

2.1 Overall Configuration of Gate Driver

Figure 1:
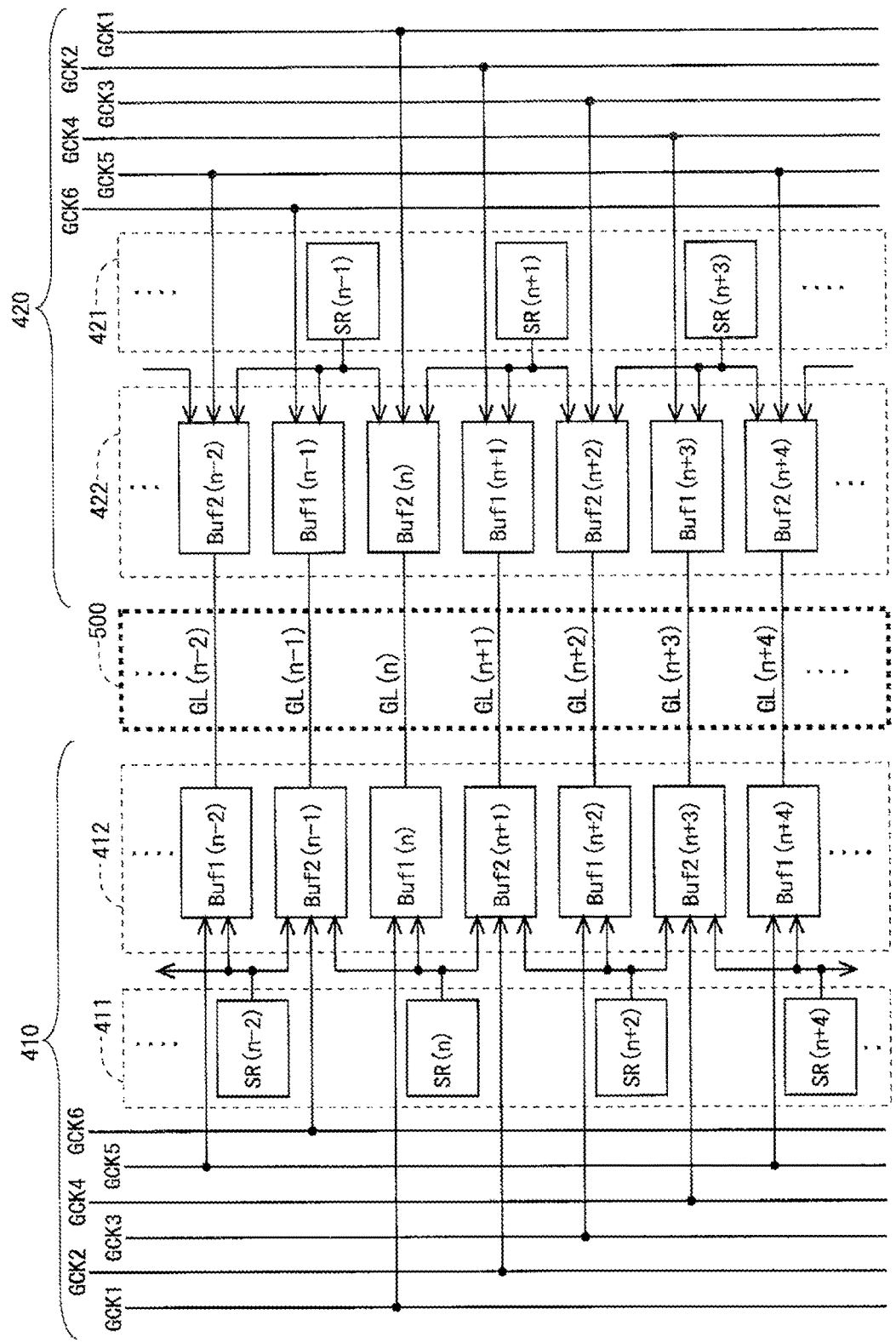
FIG. 1 is a schematic circuit diagram illustrating an overall configuration of a gate driver according to one embodiment.

FIG. 1 is a schematic circuit diagram illustrating an overall configuration of the gate driver according to the present embodiment. Note that FIG. 1 illustrates only the constituent elements corresponding to the gate bus lines GL(n−2) to GL(n+4) in the (n−2)th to (n+4)th lines. The gate driver is constituted of the first gate driver 410 arranged on one end side (left side in FIG. 1) of the gate bus lines GL(1) to GL(i), and the second gate driver 420 arranged on another end side (right side in FIG. 1) of the gate bus lines GL(1) to GL(i). Both the first gate driver 410 and the second gate driver 420 operate based on a six-phase clock signal constituted of the first to sixth gate clock signals GCK1 to GCK6.

The first gate driver 410 includes a first shift register 411 and a first scanning signal output unit 412. The first shift register 411 has a configuration in which (i/2) bistable circuits SR corresponding to (i/2) gate bus lines GL on the odd-numbered lines on a one-to-one basis are cascade-connected. The first scanning signal output unit 412 includes (i/2) first buffer circuits Buf1 connected to the (i/2) gate bus lines GL on the odd-numbered lines and (i/2) second buffer circuits Buf2 connected to the (i/2) gate bus lines GL on the even-numbered lines.

The second gate driver 420 includes a second shift register 421 and a second scanning signal output unit 422. The second shift register 421 has a configuration in which the (i/2) bistable circuits SR corresponding to the (i/2) gate bus lines GL on the even-numbered lines on a one-to-one basis are cascade-connected. The second scanning signal output unit 422 includes (i/2) first buffer circuits Buf1 connected to the (i/2) gate bus lines GL on the even-numbered lines and (i/2) second buffer circuits Buf2 connected to the (i/2) gate bus lines GL on the odd-numbered lines.

Note that each of the bistable circuits SR and each of the second buffer circuits Buf2 are also connected to first and second shift direction control lines (not illustrated in FIG. 1) that respectively supply first and second shift direction control signals for controlling the shift direction (scanning order of the plurality of gate bus lines). The identical reference sign UDa is assigned to the first shift direction control signal and the first shift direction control line, and the identical reference sign UDb is assigned to the second shift direction control signal and the second shift direction control line. In the present embodiment, the first control line is achieved by the first shift direction control line UDa, and the second control line is achieved by the second shift direction control line UDb.

Figure 30:
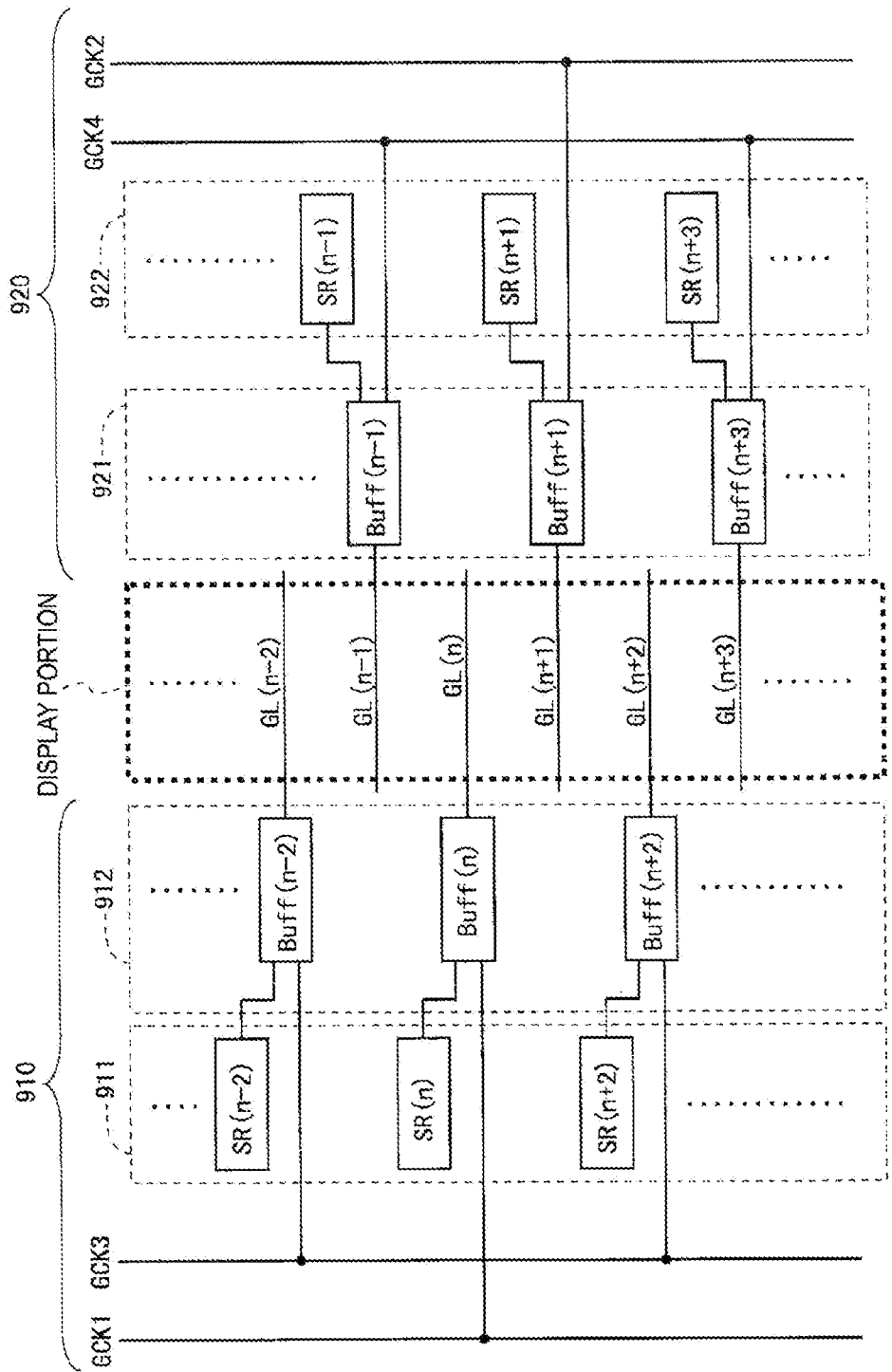
FIG. 30 is a schematic circuit diagram illustrating a configuration of a gate driver adopting an interlaced arrangement method constituted of a first gate driver and a second gate driver arranged on one end side and another end side of gate bus lines, respectively for the related example.

In the gate driver according to the present embodiment, unlike the known gate driver illustrated in FIG. 30, the output signal from each of the bistable circuits SR in the first shift register 411 and the second shift register 421 controls the operation of one first buffer circuit Buf1 and two second buffer circuits Buf2. In this regard, in the first gate driver 410, for example, the output signal from the bistable circuit SR(n) corresponding to the gate bus line GL(n) on the nth line is given to the second buffer circuit Buf2(*n*−1) connected to the gate bus line GL(n−1) on the (n−1)th line, the first buffer circuit Buf1(*n*) connected to the gate bus line GL(n) on the nth line, and the second buffer circuit Buf2 (*n*+1) connected to the gate bus line GL(n+1) on the (n+1)th line. Also, in the second gate driver 420, for example, the output signal from the bistable circuit SR(n−1) corresponding to the gate bus line GL(n−1) on the (n−1)th line is given to the second buffer circuit Buf2(*n*−2) connected to the gate bus line GL(n−2) on the (n−2)th line, the first buffer circuit Buf1(*n*−1) connected to the gate bus line GL(n−1) on the (n−1)th line, and the second buffer circuit Buf2(*n*) connected to the gate bus line GL(n) on the nth line.

Regarding the six-phase clock signal, in the first gate driver 410, one of the first gate clock signal GCK1, the third gate clock signal GCK3, and the fifth gate clock signal GCK5 is given to the first buffer circuit Buf1, and one of the second gate clock signal GCK2, the fourth gate clock signal GCK4, and the sixth gate clock signal GCK6 is given to the second buffer circuit Buf2. In the second gate driver 420, one of the second gate clock signal GCK2, the fourth gate clock signal GCK4, and the sixth gate clock signal GCK6 is given to the first buffer circuit Buf1, and one of the first gate clock signal GCK1, the third gate clock signal GCK3, and the fifth gate clock signal GCK5 is given to the second buffer circuit Buf2. Further, as illustrated in FIG. 1, an identical clock signal in the six-phase clock signal is supplied to the first buffer circuits Buf1 and the second buffer circuit Buf2 connected to an identical gate bus line GL. Furthermore, as illustrated in FIG. 1, the clock signals having different phases from each other in the six-phase clock signal are supplied to the one first buffer circuits Buf1 and the two second buffer circuits Buf2 to which the output signal of an identical bistable circuit SR is given. For details, with I as an integer, the first buffer circuit Buf1(I) connected to the gate bus line GL(I) on the Ith line, the second buffer circuit Buf2(I−1) connected to the gate bus line GL(I−1) on the (I−1)th line, and the second buffer circuit Buf2(I+1) connected to the gate bus line GL(I+1) on the (I+1)th line are supplied with clock signals having different phases from each other in the six-phase clock signal.

Each of the first buffer circuits Buf1 generates the scanning signal G to be applied to the gate bus line GL to be connected, based on the output signal of the bistable circuit SR corresponding to the gate bus line GL to be connected and the corresponding gate clock signal GCKk (k is any of 1 to 6). Each of the second buffer circuits Buf2 generates the scanning signal G to be applied to the gate bus line GL to be connected, based on the output signal of the bistable circuit SR corresponding to one gate bus line GL adjacent to the gate bus line GL to be connected, the output signal of the bistable circuit SR corresponding to another gate bus line GL adjacent to the gate bus line GL to be connected, and the corresponding gate clock signal GCKk (k is any of 1 to 6).

Incidentally, focusing on any gate bus line GL, one end portion is connected to the first buffer circuit Buf1, and another end portion is connected to the second buffer circuit Buf2. Consequently, charging and discharging of each of the gate bus lines GL is performed from the one end portion by the first buffer circuit Buf1, and also is performed from the other end portion by the second buffer circuit Buf2.

Note that in order to actually operate the bistable circuits included in the first shift register 411 and the bistable circuits included in the second shift register 421 as the shift registers, it is necessary to provide a dummy bistable circuit before the bistable circuit in the first stage and after the bistable circuit in the final stage, according to the number of phases of the gate clock signal and the like. However, since the specific configuration relating to this is obvious to those skilled in the art, the description thereof will be omitted.

2.2 Detailed Configuration of Gate Driver

With reference to FIGS. 4 to 7, a detailed configuration of the gate driver according to the present embodiment will be described, focusing on the constituent elements corresponding to the gate bus line GL(n) on the nth line.

Figure 4:
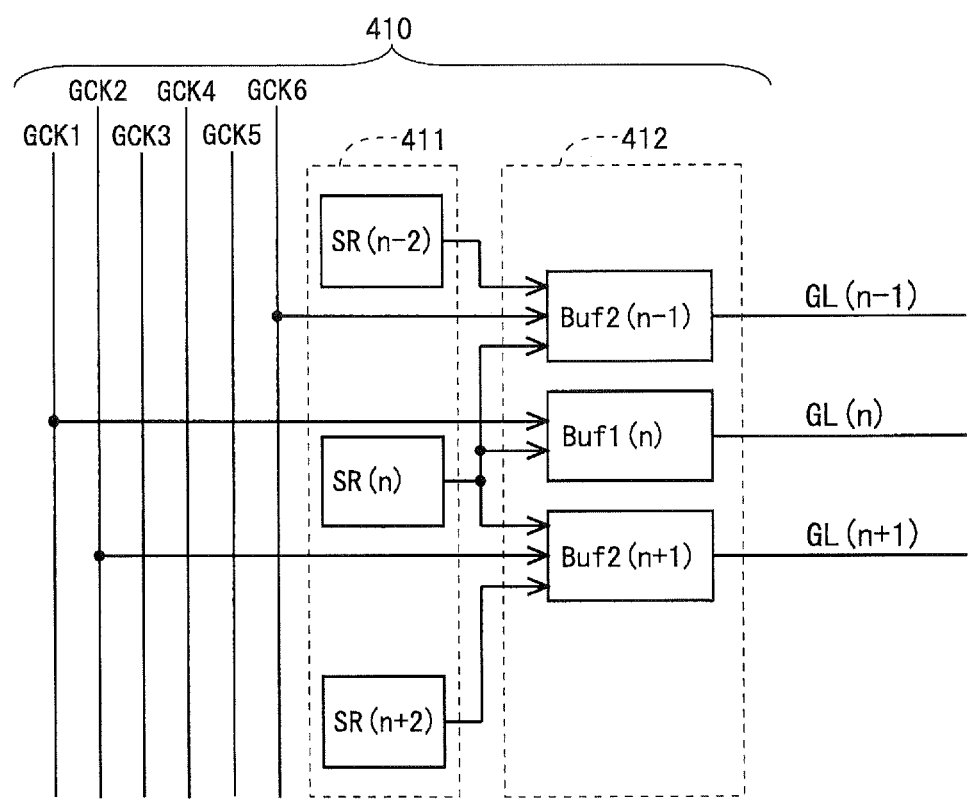
FIG. 4 is a circuit diagram illustrating a configuration of a first gate driver according to the embodiment.

As illustrated in FIG. 4, in the first gate driver 410, the gate bus line GL(n) is connected to the first buffer circuit Buf1(n). The first gate clock signal GCK1 and the output signal from the bistable circuit SR(n) are given to the first buffer circuit Buf1(n). The bistable circuit SR(n) that gives the output signal to the first buffer circuit Buf1(n) also gives the output signal to the second buffer circuit Buf2(n− 1) connected to the gate bus line GL(n− 1) on the (n− 1)th line and the second buffer circuit Buf2(n+1) connected to the gate bus line GL(n+1) on the (n+1)th line.

Figure 5:
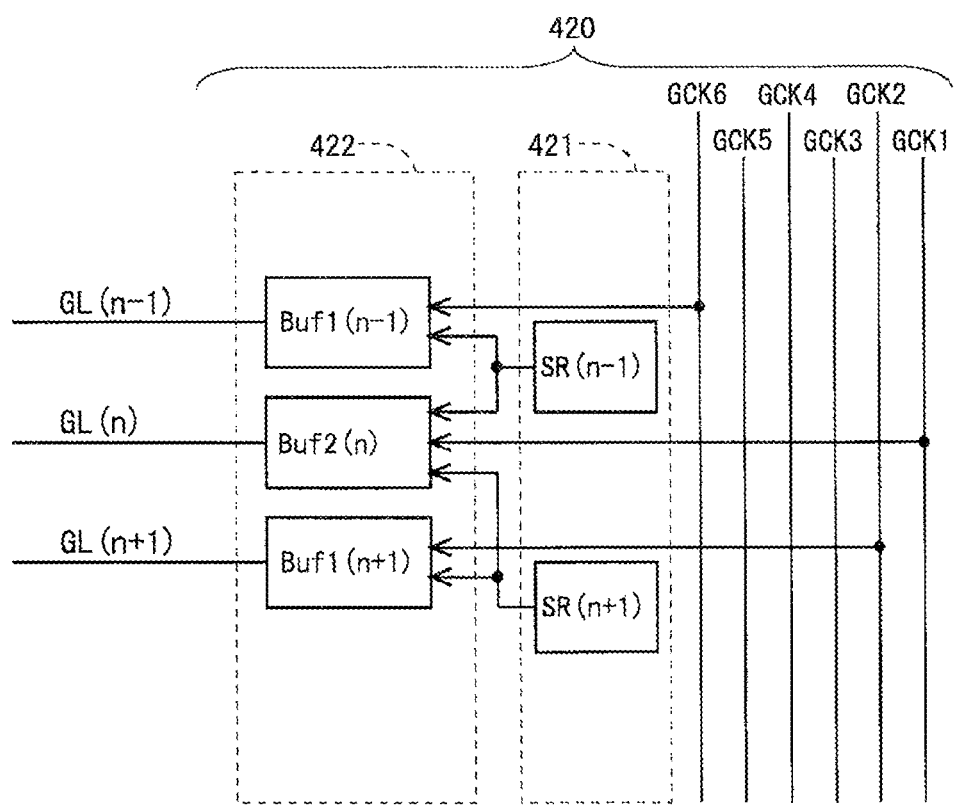
FIG. 5 is a circuit diagram illustrating a configuration of a second gate driver according to the embodiment.

As illustrated in FIG. 5, in the second gate driver 420, the gate bus line GL(n) is connected to the second buffer circuit Buf2(n). The first gate clock signal GCK1, the output signal of the bistable circuit SR(n− 1) corresponding to the gate bus line GL(n− 1) on the (n− 1)th line, and the output signal of the bistable circuit SR(n+1) corresponding to the gate bus line GL(n+1) on the (n+1)th line are given to the second buffer circuit Buf2(n).

Figure 6:
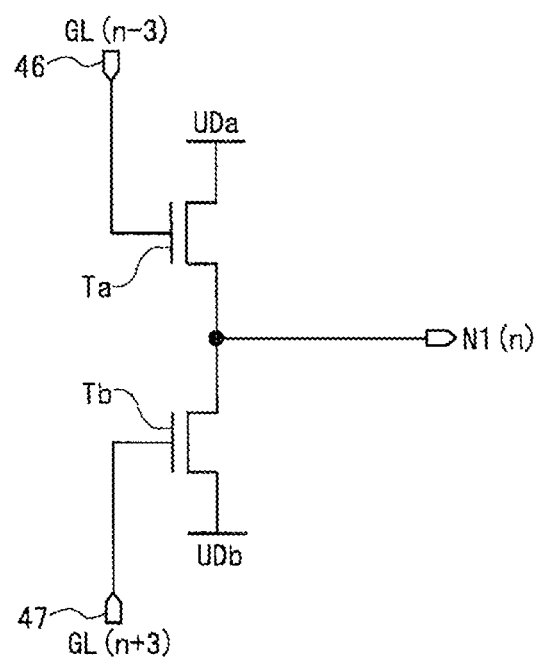
FIG. 6 is a circuit diagram illustrating a detailed configuration of a bistable circuit according to the embodiment.

FIG. 6 is a circuit diagram illustrating a detailed configuration of the bistable circuit SR(n) corresponding to the gate bus line GL(n) on the nth line. Note that the configuration of the bistable circuits SR corresponding to the gate bus lines GL other than the nth line is also the same. The bistable circuit SR(n) includes two N-channel thin film transistors Ta and Tb. For the thin film transistor Ta, a gate terminal as an input terminal 46 is connected to the gate bus line GL(n− 3) on the (n− 3)th line, a drain terminal is connected to the first shift direction control line UDa, and a source terminal is connected to the first state node N1(n). For the thin film transistor Tb, a gate terminal as an input terminal 47 is connected to the gate bus line GL(n+3) on the (n+3)th line, a drain terminal is connected to the second shift direction control line UDb, and a source terminal is connected to the first state node N1(n). Note that the first state node N1(n) is a node including an output end of the bistable circuit SR(n).

In the present embodiment, a first first state node control transistor is achieved by the thin film transistor Ta, and a second first state node control transistor is achieved by the thin film transistor Tb.

Figure 7:
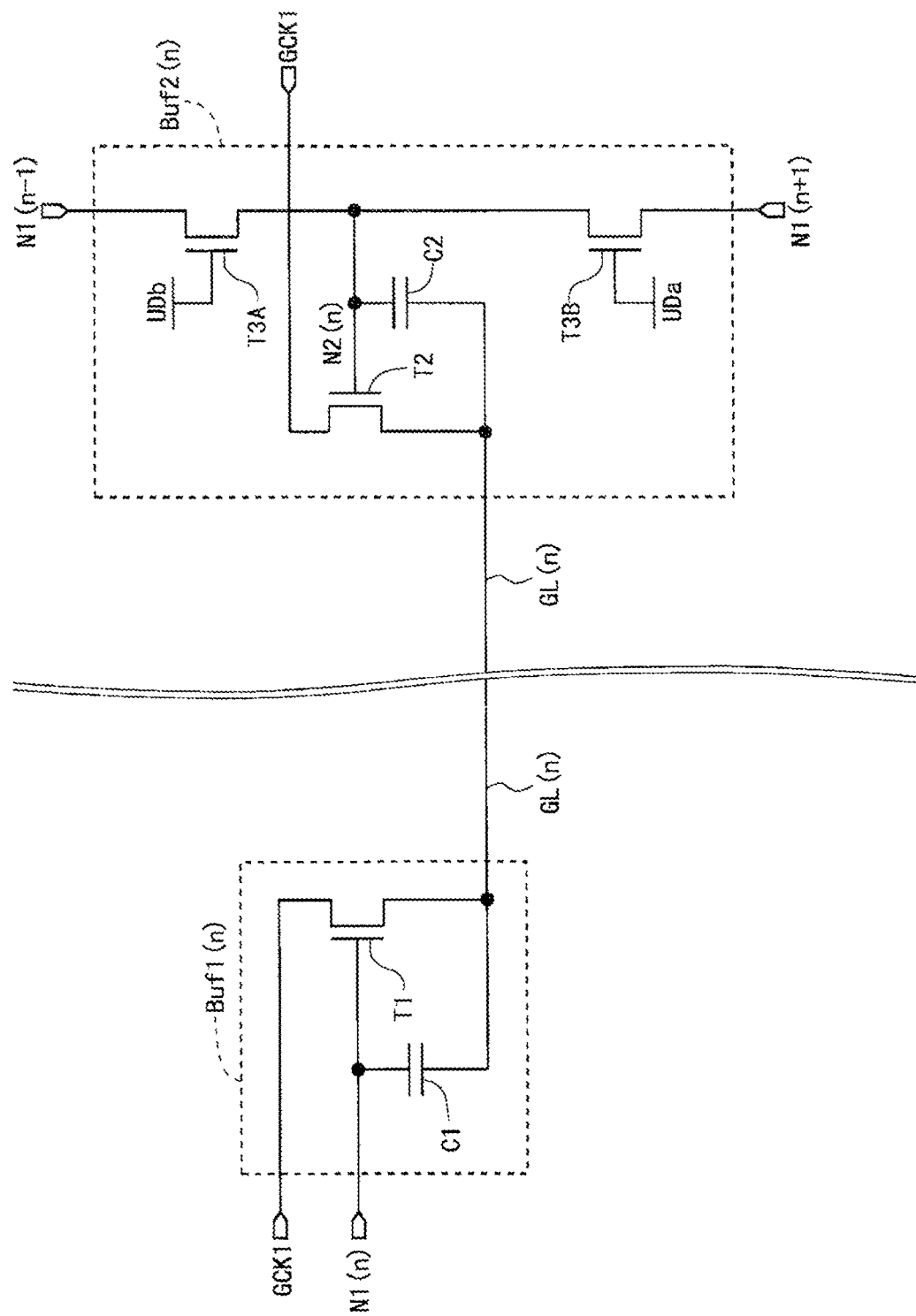
FIG. 7 is a circuit diagram illustrating a detailed configuration of buffer circuits (first buffer circuit and second buffer circuit) connected to a gate bus line on the nth line according to the embodiment.

FIG. 7 is a circuit diagram illustrating a detailed configuration of the buffer circuits (first buffer circuit Buf1(n) and second buffer circuit Buf2(n)) connected to the gate bus line GL(n) on the nth line.

The first buffer circuit Buf1(n) includes an N-channel thin film transistor T1 and a boost capacitor C1. For the thin film transistor T1, a gate terminal is connected to the first state node N1(n), the first gate clock signal GCK1 is given to a drain terminal, and a source terminal is connected to the gate bus line GL(n). For the boost capacitor C1, one end is connected to the gate terminal of the thin film transistor T1, and another end is connected to the source terminal of the thin film transistor T1. Note that the boost capacitor C1 is not an essential constituent element, and may be provided only when necessary. The same applies to a boost capacitor C2 described later.

The second buffer circuit Buf2(n) includes three N-channel thin film transistors T2, T3A, and T3B, and the boost capacitor C2. For the thin film transistor T2, a gate terminal is connected to the second state node N2(n), the first gate clock signal GCK1 is given to a drain terminal, and a source terminal is connected to the gate bus line GL(n). For the thin film transistor T3A, a gate terminal is connected to the second shift direction control line UDb, a drain terminal is connected to the first state node N1(n− 1) included in the bistable circuit SR(n− 1) corresponding to the gate bus line GL(n− 1) on the (n− 1)th line, and a source terminal is connected to the second state node N2(n). For the thin film transistor T3B, a gate terminal is connected to the first shift direction control line UDa, a drain terminal is connected to the first state node N1(n+1) included in the bistable circuit SR(n+1) corresponding to the gate bus line GL(n+1) on the (n+1)th line, and a source terminal is connected to the second state node N2(n). For the boost capacitor C2, one end is connected to the gate terminal of the thin film transistor T2, and another end is connected to the source terminal of the thin film transistor T2.

In the present embodiment, the thin film transistor T1 achieves a first buffer transistor, the boost capacitor C1 achieves a first capacitor, the thin film transistor T2 achieves a second buffer transistor, the boost capacitor C2 achieves a second capacitor, the thin film transistor T3A achieves a first control transistor, and the thin film transistor T3B achieves a second control transistor.

Note that, regarding the configuration illustrated in FIG. 6, a waveform signal having a phase identical with that of the scanning signal G(n− 3) applied to the gate bus line GL(n−3) on the (n− 3)th line may be given to the gate terminal (input terminal 46) of the thin film transistor Ta, and a waveform signal having a phase identical with that of the scanning signal G(n+3) applied to the gate bus line GL(n+3) on the (n+3)th line may be given to the gate terminal (input terminal 47) of the thin film transistor Tb. In this case, for example, for at least one of the first buffer circuit Buf1 and the second buffer circuit Buf2, a configuration divided into a buffer for driving the gate bus line GL and another buffer for generating a signal to be given to the bistable circuit illustrated in FIG. 6 is adopted.

2.3 Operation of Gate Driver

Next, with reference to FIG. 1, and FIGS. 6 to 11, the operation of the gate driver according to the present embodiment will be described. Note that, regarding the first shift direction control signal UDa and the second shift direction control signal UDb, the voltage at the high level is the high level power supply voltage VDD, and the voltage at the low level is the low level power supply voltage VSS.

2.3.1 Operation During Forward Scanning

Figure 8:
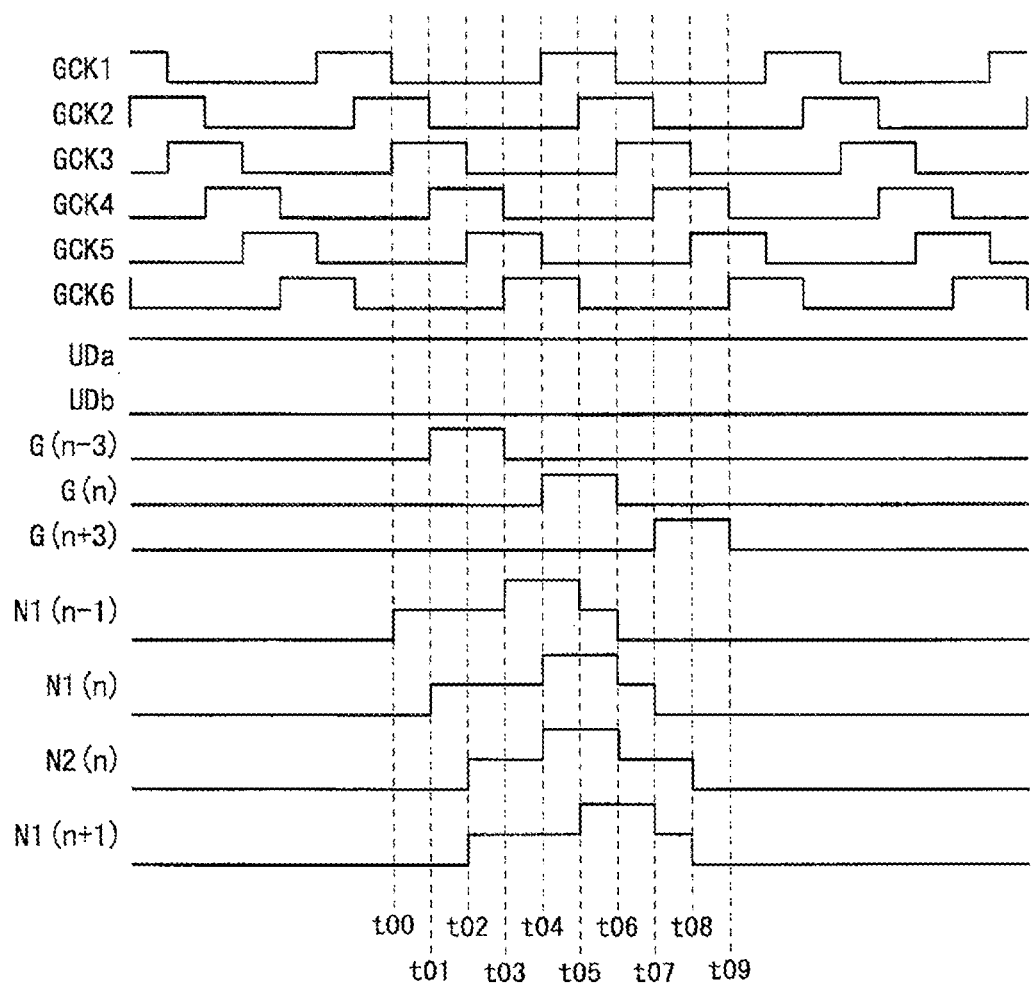
FIG. 8 is a signal waveform diagram for describing the operation of the gate driver when forward scanning is performed according to the embodiment.

FIG. 8 is a signal waveform diagram for describing the operation of the gate driver when forward scanning is performed (when the high level scanning signal G is applied to the plurality of gate bus lines GL in ascending order). Here, attention is paid to the operation in the vicinity of the period during which the gate bus line GL(n) on the nth line is in a select state.

When the forward scanning is performed, a start pulse (gate start pulse signal) for the forward scanning is given to the first shift register 411 and the second shift register 421. In other words, the start pulse is given to the bistable circuit SR on the first stage side for each of the first shift register 411 and the second shift register 421. Further, as illustrated in FIG. 8, for the six-phase clock signal, clock pulses are generated in the order of "first gate clock signal GCK1, second gate clock signal GCK2, third gate clock signal GCK3, fourth gate clock signal GCK4, fifth gate clock signal GCK5, and sixth gate clock signal GCK6". Additionally, the first shift direction control signal UDa is maintained at a high level, and the second shift direction control signal UDb is maintained at a low level.

During a period before time t00, voltages of the first state node N1(n− 1), the first state node N1(n), the second state node N2(n), and the first state node N1(n+1) are all maintained at the low levels.

At time t00, the scanning signal G(n− 4) (not illustrated in FIG. 8) changes from the low level to the high level. Consequently, in the bistable circuit SR(n− 1), the voltage of the first state node N1(n− 1) changes from the low level to the high level by the thin film transistor Ta being at the on state. At this time, since the second shift direction control signal UDb is maintained at the low level, the thin film transistor T3A in the second buffer circuit Buf2(n) is at the off state. Accordingly, even when the voltage of the first state node N1(n− 1) changes from the low level to the high level, the voltage of the second state node N2(n) is maintained at the low level.

Incidentally, the voltage level of the first state node N1(n− 1) at times t00 to t03 is a voltage level that is lower than the high level power supply voltage VDD by a threshold voltage of the thin film transistor Ta. Hereinafter, such a voltage level is referred to as a "pre-charge voltage level". Note that the threshold voltage of the thin film transistor T3A in the second buffer circuit Buf2(n) is such that the thin film transistor T3A is at the off state when the voltage level of the drain terminal and the voltage level of the source terminal exceed the pre-charge voltage level. Similarly, the threshold voltage of the thin film transistor T3B in the second buffer circuit Buf2(n) is such that the thin film transistor T3B is at the off state when the voltage level of the drain terminal and the voltage level of the source terminal exceed the pre-charge voltage level.

At time t01, the scanning signal G(n− 3) changes from the low level to the high level. Consequently, the thin film transistor Ta in the bistable circuit SR(n) is at the on state. Since the drain terminal of the thin film transistor Ta is connected to the first shift direction control line UDa, the voltage of the first state node N1(n) changes from the low level to the high level (pre-charge voltage level) when the thin film transistor Ta is at the on state. At this time, the first gate clock signal GCK1 given to the drain terminal of the thin film transistor T1 in the first buffer circuit Buf1(n) is at the low level, the scanning signal G(n) is maintained at the low level.

At time t02, the scanning signal G(n− 2) (not illustrated in FIG. 8) changes from the low level to the high level. Consequently, in the bistable circuit SR(n+1), the voltage of the first state node N1(n+1) changes from the low level to the pre-charge voltage level when the thin film transistor Ta is at the on state. At this time, since the first shift direction control signal UDa is maintained at the high level, the thin film transistor T3B in the second buffer circuit Buf2(n) is at the on state. Accordingly, the voltage of the second state node N2(n) also changes from the low level to the pre-charge voltage level as the voltage of the first state node N1(n+1) changes from the low level to the pre-charge voltage level.

At time t03, the scanning signal G(n− 3) changes from the high level to the low level. Consequently, the thin film transistor Ta in the bistable circuit SR(n) is at the off state. Further, at time t03, the sixth gate clock signal GCK6 changes from the low level to the high level, so that the voltage of the first state node N1(n− 1) further rises based on the boost operation in the first buffer circuit Buf1(n− 1) connected to the gate bus line GL(n− 1) on the (n− 1)th line.

At time t04, the first gate clock signal GCK1 changes from the low level to the high level. Consequently, in the first buffer circuit Buf1(n), charging of the gate bus line GL(n) on the nth line via the thin film transistor T1 is started. At this time, the voltage change of the gate bus line GL(n) (that is, the voltage change of the scanning signal G(n)) pushes up the voltage of the first state node N1(n) via the boost capacitor C1. By such a boost operation, a voltage sufficiently higher than the normal high level is applied to the gate terminal of the thin film transistor T1. As a result, the thin film transistor T1 is at the completely on state, and the gate bus line GL(n) on the nth line is charged to the completely high level from the one end side (left side in FIG. 1).

As illustrated in FIG. 7, the first gate clock signal GCK1 is also given to the second buffer circuit Buf2(n). For details, the first gate clock signal GCK1 is given to the drain terminal of the thin film transistor T2 in the second buffer circuit Buf2(n). Further, at the time immediately before time t04, the voltage of the second state node N2(n) is at the pre-charge voltage level. Therefore, at time t04, charging of the gate bus line GL(n) on the nth line via the thin film transistor T2 is started in the second buffer circuit Buf2(n). At this time, the voltage change of the gate bus line GL(n) pushes up the voltage of the second state node N2(n) via the boost capacitor C2. Consequently, the voltage sufficiently higher than the normal high level is applied to the gate terminal of the thin film transistor T2. As a result, the thin film transistor T2 is at the completely on state, and the gate bus line GL(n) on the nth line is charged to the completely high level also from the other end side (right side in FIG. 1).

At time t05, the sixth gate clock signal GCK6 changes from the high level to the low level, so that the voltage of the first state node N1(n− 1) drops to the pre-charge voltage level. At this time, the thin film transistor T3A is at the off state, and the voltage of the second state node N2(n) does not change. Further, at time t05, the second gate clock signal GCK2 changes from the low level to the high level, so that the voltage of the first state node N1(n+1) further rises based on the boost operation in the first buffer circuit Buf1(n+1) connected to the gate bus line GL(n+1) on the (n+1)th line. As described above, since the thin film transistor T3B has a threshold voltage that changes the thin film transistor T3B to the off state when the voltage level of the drain terminal and the voltage level of the source terminal exceed the pre-charge voltage level, at this time, the thin film transistor T3B is at the off state and the voltage of the second state node N2(n) does not change.

At time t06, the first gate clock signal GCK1 changes from the high level to the low level. Consequently, the electric charge of the gate bus line GL(n) on the nth line is discharged from the one end side (left side in FIG. 1) via the thin film transistor T1 in the first buffer circuit Buf1(n), and also discharged from the other end side (right side in FIG. 1) via the thin film transistor T2 in the second buffer circuit Buf2(n). As a result, the voltage of the scanning signal G(n) drops to the low level at high speed. In this way, the gate bus line GL(n) on the nth line, which was in the select state at time t04, quickly changes to the non-select state at time t06.

As described above, at time t06, the voltage of the scanning signal G(n) changes from the high level to the low level. Consequently, the voltage of the first state node N1(n) via the boost capacitor C1 in the first buffer circuit Buf1(n) drops, and the voltage of the second state node N2(n) via the boost capacitor C2 in the second buffer circuit Buf2(n) drops.

At time t06, the scanning signal G(n+2) (not illustrated in FIG. 8) changes from the low level to the high level. Consequently, in the bistable circuit SR(n− 1), the thin film transistor Tb is at the on state, so that the voltage of the first state node N1(n− 1) drops to the low level.

At time t07, the scanning signal G(n+3) is changed from the low level to the high level. Consequently, the thin film transistor Tb in the bistable circuit SR(n) is at the on state. Since the drain terminal of the thin film transistor Tb is connected to the second shift direction control line UDb, the voltage of the first state node N1(n) drops to the low level when the thin film transistor Tb is at the on state.

At time t08, the scanning signal G(n+4) (not illustrated in FIG. 8) changes from the low level to the high level. Consequently, in the bistable circuit SR(n+1), the thin film transistor Tb is at the on state, so that the voltage of the first state node N1(n+1) drops to the low level. At this time, the thin film transistor T3B in the second buffer circuit Buf2(n) is at the on state, and the voltage of the second state node N2(n) also drops to the low level.

At time t09, the scanning signal G(n+3) changes from the high level to the low level. Consequently, the thin film transistor Tb in the bistable circuit SR(n) is at the off state.

Note that, in this example, the operation at time t01 achieves the first first state node control transistor turn-on step, the operation at time t03 achieves the first first state node control transistor turn-off step, the operation at time t07 achieves the second first state node control transistor turn-on step, and the operation at time t09 achieves the second first state node control transistor turn-off step.

Figure 9:
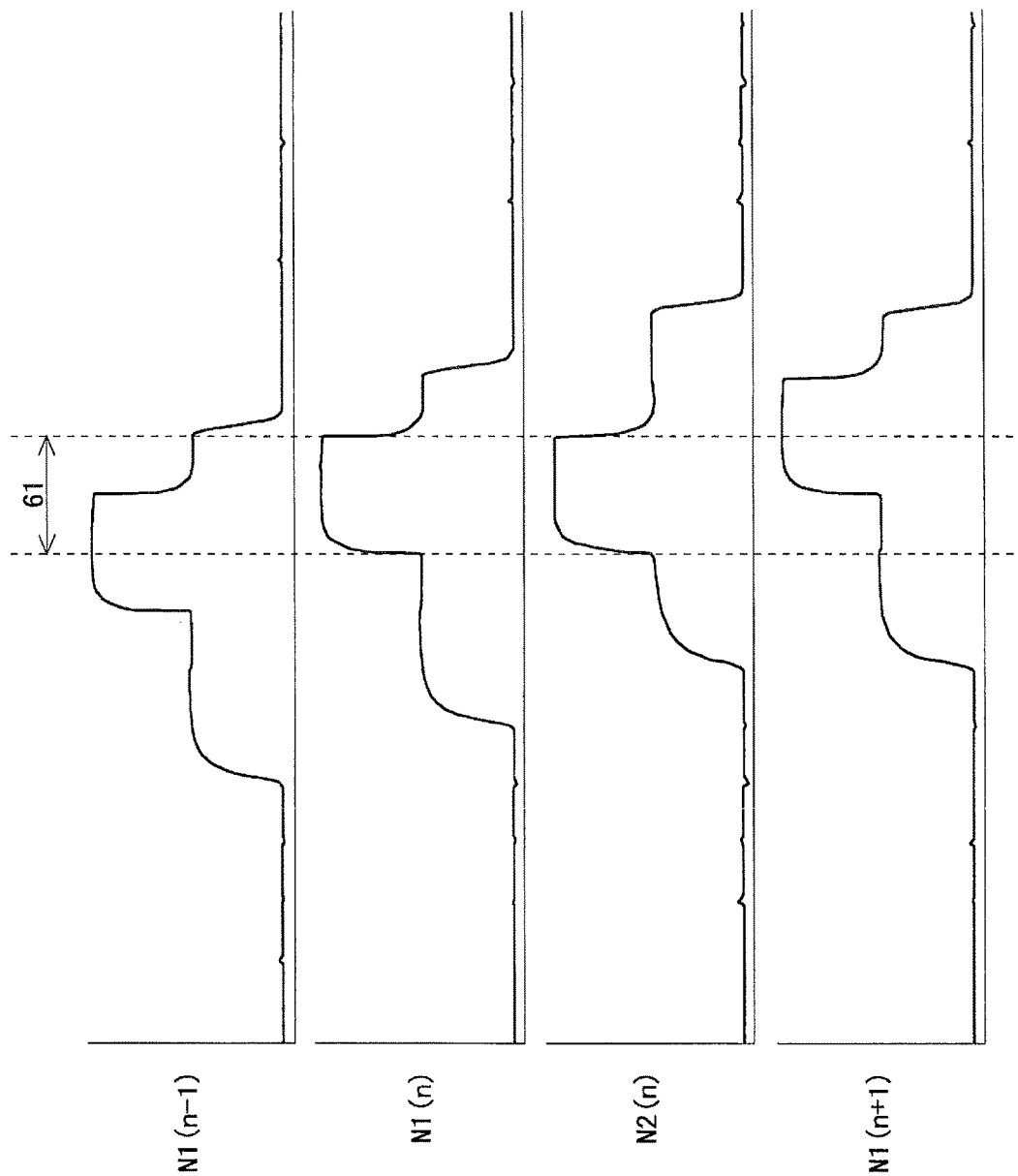
FIG. 9 is a signal waveform diagram during the forward scanning obtained by simulation for the embodiment.

FIG. 9 is a signal waveform diagram during the forward scanning obtained by simulation. For each waveform, the horizontal axis represents time and the vertical axis represents voltage. The voltage change of the first state node N1(n) and the voltage change of the second state node N2(n) do not depend on the voltage change of the first state node N1(n− 1). Focusing on the voltages of the first state node N1(n) and the second state node N2(n), after the voltage of the first state node N1(n) changes from the low level to the pre-charge voltage level, the voltage of the second state node N2(n) changes from the low level to the pre-charge voltage level. Then, the first state node N1(n) and the second state node N2(n) are maintained at the voltage sufficiently higher than the normal high level during the same period (the period indicated by the two-headed arrow with reference numeral 61). Thereafter, the voltage of the first state node N1(n) changes from the pre-charge voltage level to the low level, and then the voltage of the second state node N2(n) changes from the pre-charge voltage level to the low level. Here, the voltage of the second state node N2(n) changes from the low level to the pre-charge voltage level at the same timing as the voltage of the first state node N1(n+1), and the voltage of the second state node N2(n) changes from the pre-charge voltage level to the low level at the same timing as the voltage of the first state node N1(n+1). That is, the voltage change of the second state node N2(n) depends on the voltage change of the first state node N1(n+1).

2.3.2 Operation During Reverse Scanning

Figure 10:
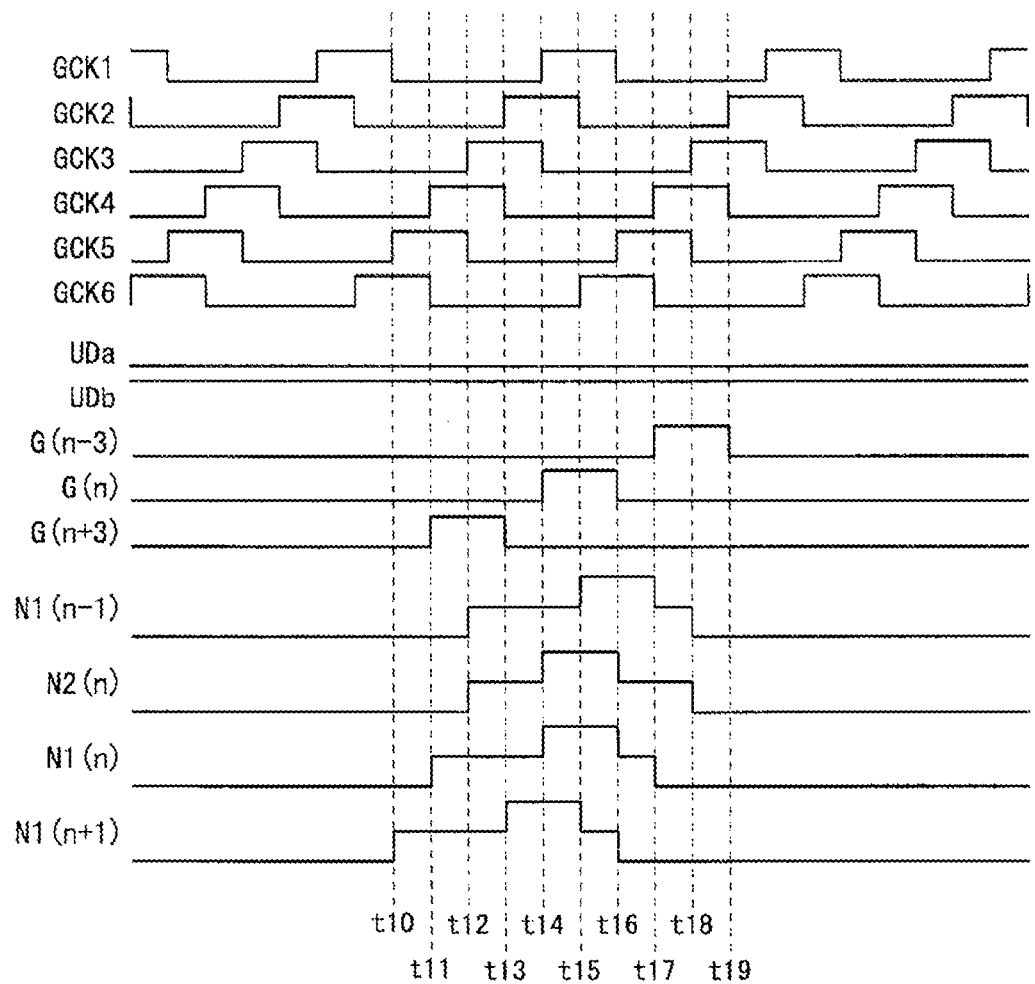
FIG. 10 is a signal waveform diagram for describing the operation of the gate driver when reverse scanning is performed according to the embodiment.

FIG. 10 is a signal waveform diagram for describing the operation of the gate driver when reverse scanning is performed (when the high level scanning signal G is applied to the plurality of gate bus lines GL in descending order). Here, too, attention is paid to the operation in the vicinity of the period during which the gate bus line GL(n) on the nth line is in the select state.

When the reverse scanning is performed, a start pulse (gate start pulse signal) for the reverse scanning is given to the first shift register 411 and the second shift register 421. In other words, the start pulse is given to the bistable circuit SR on the final stage side for the first shift register 411 and the second shift register 421. Further, as illustrated in FIG. 10, for the six-phase clock signal, clock pulses are generated in the order of "sixth gate clock signal GCK6, fifth gate clock signal GCK5, fourth gate clock signal GCK4, third gate clock signal GCK3, second gate clock signal GCK2, and first gate clock signal GCK1". Additionally, the first shift direction control signal UDa is maintained at the low level, and the second shift direction control signal UDb is maintained at the high level.

During a period before time t10, voltages of the first state node N1(n− 1), the second state node N2(n), the first state node N1(n), and the first state node N1(n+1) are all maintained at the low levels.

At time t10, the scanning signal G(n+4) (not illustrated in FIG. 10) changes from the low level to the high level. Consequently, in the bistable circuit SR(n+1), the voltage of the first state node N1(n+1) changes from the low level to the high level by the thin film transistor Tb being at the on state. At this time, since the first shift direction control signal UDa is maintained at the low level, the thin film transistor T3B in the second buffer circuit Buf2(n) is at the off state. Accordingly, even when the voltage of the first state node N1(n+1) changes from the low level to the high level, the voltage of the second state node N2(n) is maintained at the low level.

At time t11, the scanning signal G(n+3) changes from the low level to the high level. Consequently, the thin film transistor Tb in the bistable circuit SR(n) is at the on state. Since the drain terminal of the thin film transistor Tb is connected to the second shift direction control line UDb, the voltage of the first state node N1(n) changes from the low level to the high level (pre-charge voltage level) when the thin film transistor Tb is at the on state. At this time, the first gate clock signal GCK1 given to the drain terminal of the thin film transistor T1 in the first buffer circuit Buf1(n) is at the low level, the scanning signal G(n) is maintained at the low level.

At time t12, the scanning signal G(n+2) (not illustrated in FIG. 10) changes from the low level to the high level. Consequently, in the bistable circuit SR(n− 1), the voltage of the first state node N1(n− 1) changes from the low level to the pre-charge voltage level when the thin film transistor Tb is at the on state. At this time, since the second shift direction control signal UDb is maintained at the high level, the thin film transistor T3A in the second buffer circuit Buf2(n) is at the on state. Accordingly, the voltage of the second state node N2(n) also changes from the low level to the pre-charge voltage level as the voltage of the first state node N1(n− 1) changes from the low level to the pre-charge voltage level.

At time t13, the scanning signal G(n+3) changes from the high level to the low level. Consequently, the thin film transistor Tb in the bistable circuit SR(n) is at the off state. Further, at time t13, the second gate clock signal GCK2 changes from the low level to the high level, so that the voltage of the first state node N1(n+1) further rises based on the boost operation in the first buffer circuit Buf1(n+1) connected to the gate bus line GL(n+1) on the (n+1)th line.

At time t14, the first gate clock signal GCK1 changes from the low level to the high level. Consequently, similar to the time t04 when the forward scanning is performed (see FIG. 8), the gate bus line GL(n) on the nth line is charged to the completely high level from both the one end side (left side in FIG. 1) and the other end side (right side in FIG. 1).

At time t15, the second gate clock signal GCK2 changes from the high level to the low level, so that the voltage of the first state node N1(n+1) drops to the pre-charge voltage level. At this time, the thin film transistor T3B is at the off state, and the voltage of the second state node N2(n) does not change. Further, at time t15, the sixth gate clock signal GCK6 changes from the low level to the high level, so that the voltage of the first state node N1(n− 1) further rises based on the boost operation in the first buffer circuit Buf1(n−1) connected to the gate bus line GL(n−1) on the (n−1)th line. As described above, since the thin film transistor T3A has a threshold voltage that changes the thin film transistor T3A to the off state when the voltage level of the drain terminal and the voltage level of the source terminal exceed the pre-charge voltage level, at this time, the thin film transistor T3A is at the off state and the voltage of the second state node N2(n) does not change.

At time t16, the first gate clock signal GCK1 changes from the high level to the low level. Consequently, similar to the time t06 when the forward scanning is performed (see FIG. 8), the electric charge of the gate bus line GL(n) on the nth line is discharged from the one end side (left side in FIG. 1) via the thin film transistor T1 in the first buffer circuit Buf1(n), and also discharged from the other end side (right side in FIG. 1) via the thin film transistor T2 in the second buffer circuit Buf2(n). As a result, the voltage of the scanning signal G(n) drops to the low level at high speed. In this way, the gate bus line GL(n) on the nth line, which was in the select state at time t14, quickly changes to the non-select state at time t16. Further, similar to time t06 when the forward scanning is performed (see FIG. 8), the voltage of the first state node N1(n) and the voltage of the second state node N2(n) drop.

Further at time t16, the scanning signal G(n−2) (not illustrated in FIG. 10) changes from the low level to the high level. Consequently, in the bistable circuit SR(n+1), the thin film transistor Ta is at the on state, so that the voltage of the first state node N1(n+1) drops to the low level.

At time t17, the scanning signal G(n−3) changes from the low level to the high level. Consequently, the thin film transistor Ta in the bistable circuit SR(n) is at the on state. Since the drain terminal of the thin film transistor Ta is connected to the first shift direction control line UDa, the voltage of the first state node N1(n) drops to the low level when the thin film transistor Ta is at the on state.

At time t18, the scanning signal G(n−4) (not illustrated in FIG. 10) changes from the low level to the high level. Consequently, in the bistable circuit SR(n−1), the thin film transistor Ta is at the on state, so that the voltage of the first state node N1(n−1) drops to the low level. At this time, the thin film transistor T3A in the second buffer circuit Buf2(n) is at the on state, and the voltage of the second state node N2(n) also drops to the low level.

At time t19, the scanning signal G(n−3) changes from the high level to the low level. Consequently, the thin film transistor Ta in the bistable circuit SR(n) is at the off state.

Note that, in this example, the operation at time t11 achieves the second first state node control transistor turn-on step, the operation at time t13 achieves the second first state node control transistor turn-off step, the operation at time t17 achieves the first first state node control transistor turn-on step, and the operation at time t19 achieves the first first state node control transistor turn-off step.

Figure 11:
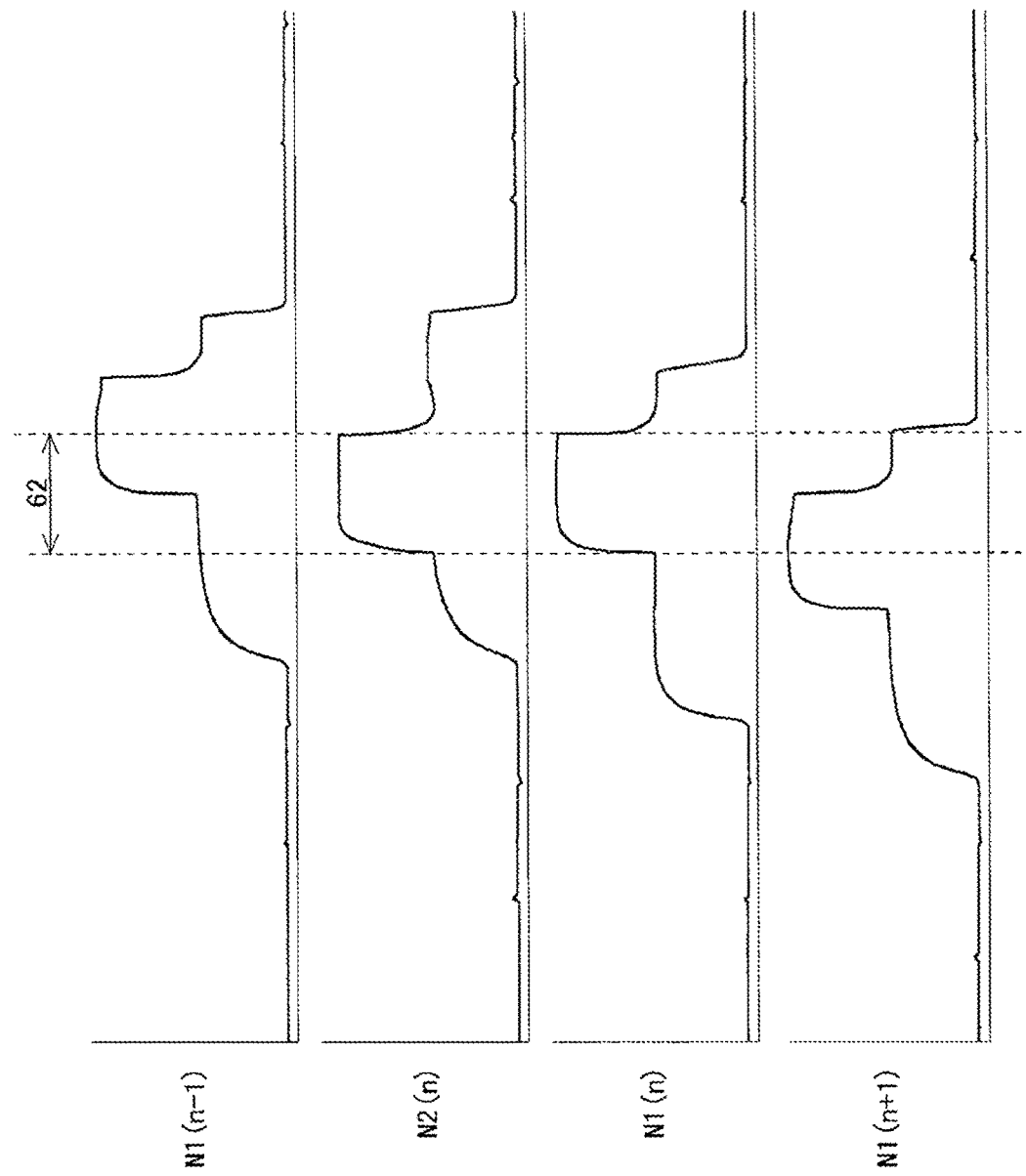
FIG. 11 is a signal waveform diagram during the reverse scanning obtained by simulation for the embodiment.

FIG. 11 is a signal waveform diagram during the reverse scanning obtained by simulation. For each waveform, the horizontal axis represents time and the vertical axis represents voltage. The voltage change of the first state node N1(n) and the voltage change of the second state node N2(n) do not depend on the voltage change of the first state node N1(n+1). Focusing on the voltages of the first state node N1(n) and the second state node N2(n), after the voltage of the first state node N1(n) changes from the low level to the pre-charge voltage level, the voltage of the second state node N2(n) changes from the low level to the pre-charge voltage level. Then, the first state node N1(n) and the second state node N2(n) are maintained at the voltage sufficiently higher than the normal high level during the same period (the period indicated by the two-headed arrow with reference numeral 62). Thereafter, the voltage of the first state node N1(n) changes from the pre-charge voltage level to the low level, and then the voltage of the second state node N2(n) changes from the pre-charge voltage level to the low level. Here, the voltage of the second state node N2(n) changes from the low level to the pre-charge voltage level at the same timing as the voltage of the first state node N1(n−1), and the voltage of the second state node N2(n) changes from the pre-charge voltage level to the low level at the same timing as the voltage of the first state node N1(n−1). That is, the voltage change of the second state node N2(n) depends on the voltage change of the first state node N1(n−1).

2.4 Size of Thin Film Transistor and Capacitance Value of Boost Capacitor

Here, the size of the thin film transistor and the capacitance value of the boost capacitor will be described. As described above, in the present embodiment, charging/discharging of each of the gate bus lines GL is performed from the one end portion by the first buffer circuit Buf1, and also is performed from the other end portion by the second buffer circuit Buf2. In this regard, it is preferable that the charging/discharging of the gate bus line GL from the one end portion and the charging/discharging of the gate bus line GL from the other end portion be performed in the same manner. However, the circuit configuration and the input signal of the first buffer circuit Buf1 are different from those of the second buffer circuit Buf2. Thus, the voltage waveform of the first state node N1 and the voltage waveform of the second state node N2 are different from each other. Further, the efficiency of the boost operation by the boost capacitor of the first buffer circuit Buf1 is also different from that of the second buffer circuit Buf2. Thus, it is preferable that the thin film transistor T1 and the thin film transistor T2 be set to different sizes and the boost capacitor C1 and the boost capacitor C2 be set to different capacitance values, so that the drive capability of the gate bus line GL by the first buffer circuit Buf1 and the drive capability of the gate bus line GL by the second buffer circuit Buf2 are about the same. By optimizing the sizes of the thin film transistors T1 and T2 as the buffer transistors and the efficiency of the boost operation, the element sizes can be minimized and the frame narrowing can be achieved. Further, in a case that the drive capability of the gate bus line GL by the first buffer circuit Buf1 and the drive capability of the gate bus line GL by the second buffer circuit Buf2 are about the same, the magnitude of the feed-through voltage at each pixel forming section ps in the vicinity of the one end portion is about the same as that in the vicinity of the other end portion, when each of the gate bus lines GL shifts from the select state to the non-select state. With this, the generation of flicker is suppressed.

Note that the drive capability of the thin film transistor is determined by the ratio W/L of the channel width W and the channel length L. Here, assuming that the channel length L is constant, setting the size of the thin film transistor means setting the channel width W.

3. Advantageous Effects

According to the present embodiment, each of the gate bus lines GL in the display portion 500 is driven by the first gate driver 410 and the second gate driver 420. In other words, the high level or low level voltages are applied to each of the gate bus lines GL from both the ends thereof as the scanning signals G. Consequently, since each of the gate bus lines GL can be charged and discharged at high speed, an image can be satisfactorily displayed even on the large display portion 500 by driving at high speed. Here, the first shift register 411 in the first gate driver 410 is constituted of the bistable circuits SR corresponding to the gate bus lines GL on the odd-numbered lines, and the second shift register 421 in the second gate driver 420 is constituted of the bistable circuits SR corresponding to the gate bus lines GL on the even-numbered lines. Then, the operation of the three buffer circuits (one first buffer circuit Buf1 and two second buffer circuits Buf2) is controlled by the output signal of each of the bistable circuits SR. Since such a configuration is adopted, the area required for achieving the shift register is reduced as compared with the known configuration, so that the narrowing of the frame of the liquid crystal panel 600 as a display panel can be achieved.

Further, each of the bistable circuits SR is provided with the two thin film transistors as constituent elements for controlling the voltage of the first state node N1 connected to the gate terminal of the thin film transistor T1 as the buffer transistor in the first buffer circuit Buf1 connected to the gate bus line GL. For details, with J and K as integers, the bistable circuit SR(K) corresponding to the gate bus line GL(K) on the Kth line is provided with the thin film transistor Ta having the gate terminal connected to the gate bus line GL(K−J) on the (K−J)th line, the drain terminal connected to the first shift direction control line UDa, and the source terminal connected to the first state node N1(K), and the thin film transistor Tb having the gate terminal connected to the gate bus line GL(K+J) on the (K+J)th line, the drain terminal connected to the second shift direction control line UDb, and the source terminal connected to the first state node N1(K). Here, when the forward scanning is performed, the first shift direction control signal UDa is maintained at the high level and the second shift direction control signal UDb is maintained at the low level, and when the reverse scanning is performed, the first shift direction control signal UDa is maintained at the low level and the second shift direction control signal UDb is maintained at the high level. Further, the second buffer circuit Buf2(K) is configured to drive the gate bus line GL(K) to be connected, based on the output signal of the bistable circuit SR(K−1) corresponding to the one gate bus line GL(K−1) adjacent to the gate bus line GL(K) to be connected, the output signal of the bistable circuit SR(K+1) corresponding to the other gate bus line GL(K+1) adjacent to the gate bus line GL(K) to be connected, and the gate clock signal GCK. According to the configuration described above, when the start pulse is applied to the bistable circuits SR on the first stage side for the first shift register 411 and the second shift register 421, the forward scanning is performed, and when the start pulse is applied to the bistable circuits SR on the final stage side for the first shift register 411 and the second shift register 421, the reverse scanning is performed. In this manner, it is possible to switch the scanning order of the gate bus lines GL.

As described above, according to the present embodiment, the liquid crystal display device capable of high speed charging/discharging of the gate bus lines GL and switching of the scanning order of the gate bus lines GL, and the frame narrowing can be achieved.

4. Modified Example

In the above embodiment, regarding the bistable circuit SR corresponding to each of the gate bus lines (see FIG. 6), the input terminal 46 is connected to the gate bus line three lines before, and the input terminal 47 is connected to the gate bus line three lines later. Further, the number of phases of the multi-phase clock signal used as the gate clock signal GCK is six, and the pulse width of each gate clock signal GCK is a length corresponding to the two horizontal scan periods. However, various modifications can be made to these. Then, modified examples of the above-described embodiment will be described below. Note that, in the following, the length corresponding to the z horizontal scan periods with z as an integer is referred to as "zH". For example, the length corresponding to the two horizontal scan periods is referred to as "2H".

4.1 First Modified Example

Figure 12:
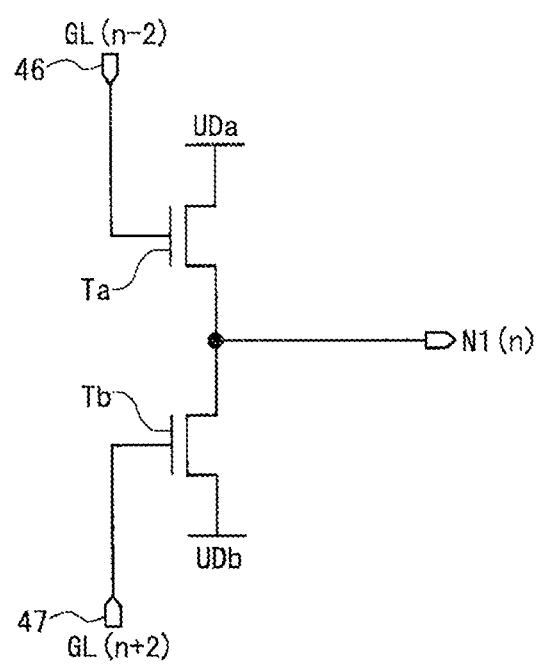
FIG. 12 is a circuit diagram illustrating a detailed configuration of a bistable circuit according to a first modified example.

FIG. 12 is a circuit diagram illustrating a detailed configuration of a bistable circuit SR(n) in the present modified example. The input terminal 46 (the gate terminal of the thin film transistor Ta) is connected to the gate bus line GL(n− 2) on the (n− 2)th line, and the input terminal 47 (the gate terminal of the thin film transistor Tb) is connected to the gate bus line GL(n+2) on the (n+2)th line. The number of phases of the multi-phase clock signal (gate clock signal GCK) used is four. Note that the number of phases of the multi-phase clock signal used may be five or more. The pulse width of each gate clock signal GCK is 1H.

Figure 13:
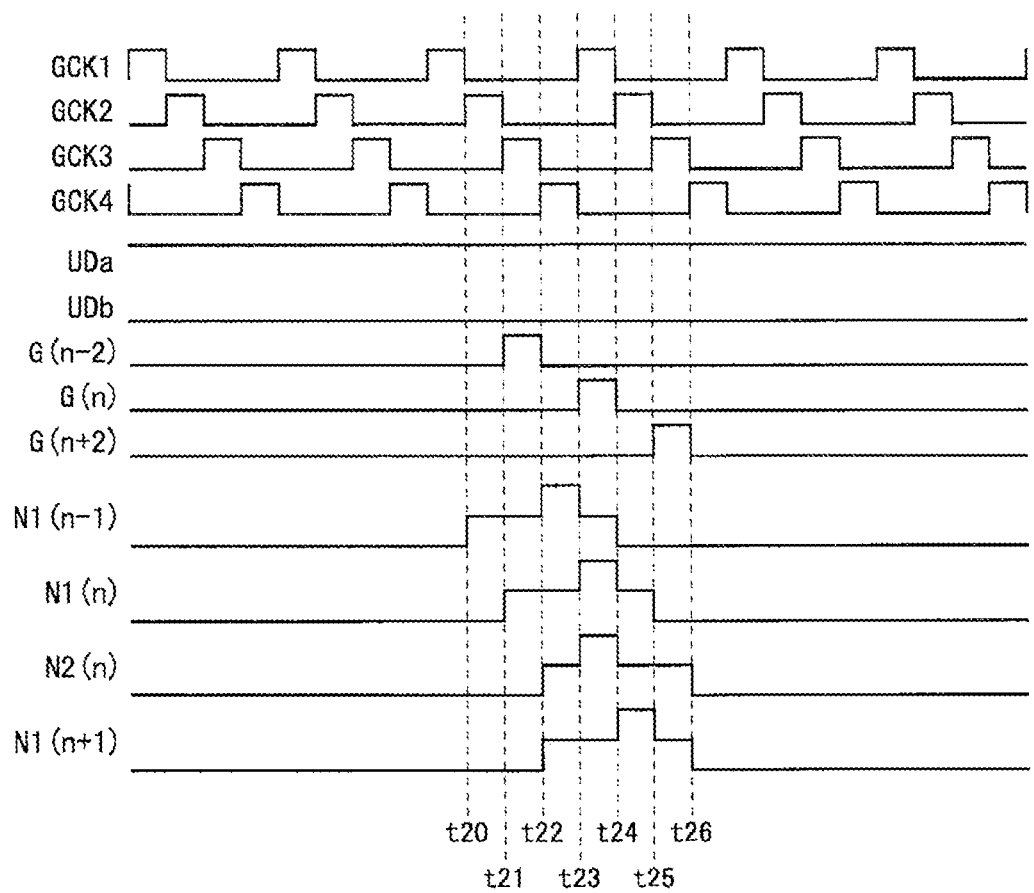
FIG. 13 is a signal waveform diagram for describing the operation of the gate driver when the forward scanning is performed according to the first modified example.

FIG. 13 is a signal waveform diagram for describing the operation of the gate driver when the forward scanning is performed. The voltage of the first state node N1(n) changes from the low level to the pre-charge voltage level at time t21 and then changes to the voltage level sufficiently higher than the normal high level at time t23. Then, for the period of 1H, the sufficiently high voltage level is maintained. That is, the voltage of the first state node N1(n) changes to the pre-charge voltage level at time t24. Thereafter, the voltage of the first state node N1(n) changes to the low level at time t25. Also, as with the voltage of the first state node N1(n), the voltage of the second state node N2(n) is maintained at the voltage level sufficiently higher than the normal high level during the period of 1H from time t23 to time t24. By generating the clock pulses of the first to fourth gate clock signals GCK1 to GCK4 as illustrated in FIG. 13, and giving the start pulse to the bistable circuits SR on the first stage side for the first shift register 411 and the second shift register 421, the high level (on level) scanning signal G is applied to the plurality of gate bus lines GL in ascending order.

Figure 14:
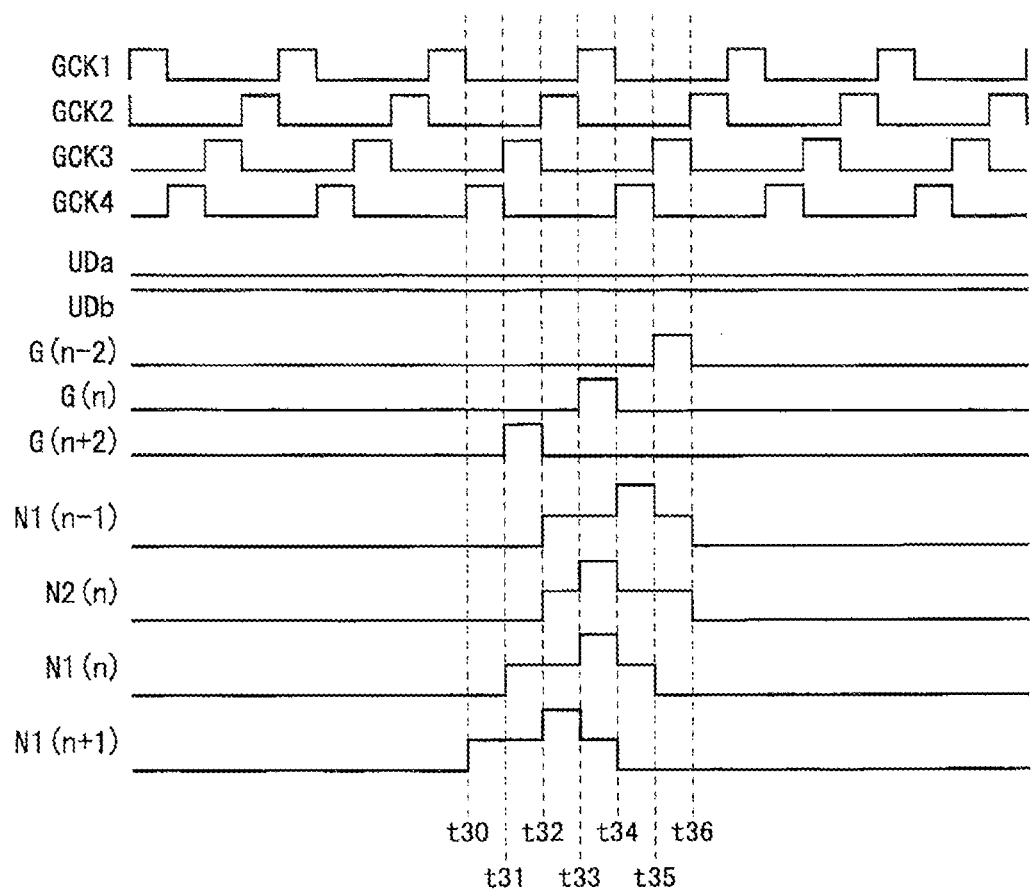
FIG. 14 is a signal waveform diagram for describing the operation of the gate driver when the reverse scanning is performed according to the first modified example.

FIG. 14 is a signal waveform diagram for describing the operation of the gate driver when the reverse scanning is performed. The voltage of the first state node N1(n) changes from the low level to the pre-charge voltage level at time t31 and then changes to the voltage level sufficiently higher than the normal high level at time t33. Then, for the period of 1H, the sufficiently high voltage level is maintained. That is, the voltage of the first state node N1(n) changes to the pre-charge voltage level at time t34. Thereafter, the voltage of the first state node N1(n) changes to the low level at time t35. Also, as with the voltage of the first state node N1(n), the voltage of the second state node N2(n) is maintained at the voltage level sufficiently higher than the normal high level during the period of 1H from time t33 to time t34. By generating the clock pulses of the first to fourth gate clock signals GCK1 to GCK4 as illustrated in FIG. 14, and giving the start pulse to the bistable circuits SR on the final stage side for the first shift register 411 and the second shift register 421, the high level (on level) scanning signal G is applied to the plurality of gate bus lines GL in descending order.

4.2 Second Modified Example

In the present modified example, the connection destinations of the input terminal 46 (the gate terminal of the thin film transistor Ta) and the input terminal 47 (the gate terminal of the thin film transistor Tb) of the bistable circuit SR are the same as those in the above embodiment (see FIG. 6). The number of phases of the multi-phase clock signal (gate clock signal GCK) used is five. Note that the number of phases of the multi-phase clock signal used may be six or more. The pulse width of each gate clock signal GCK is 1H.

Figure 15:
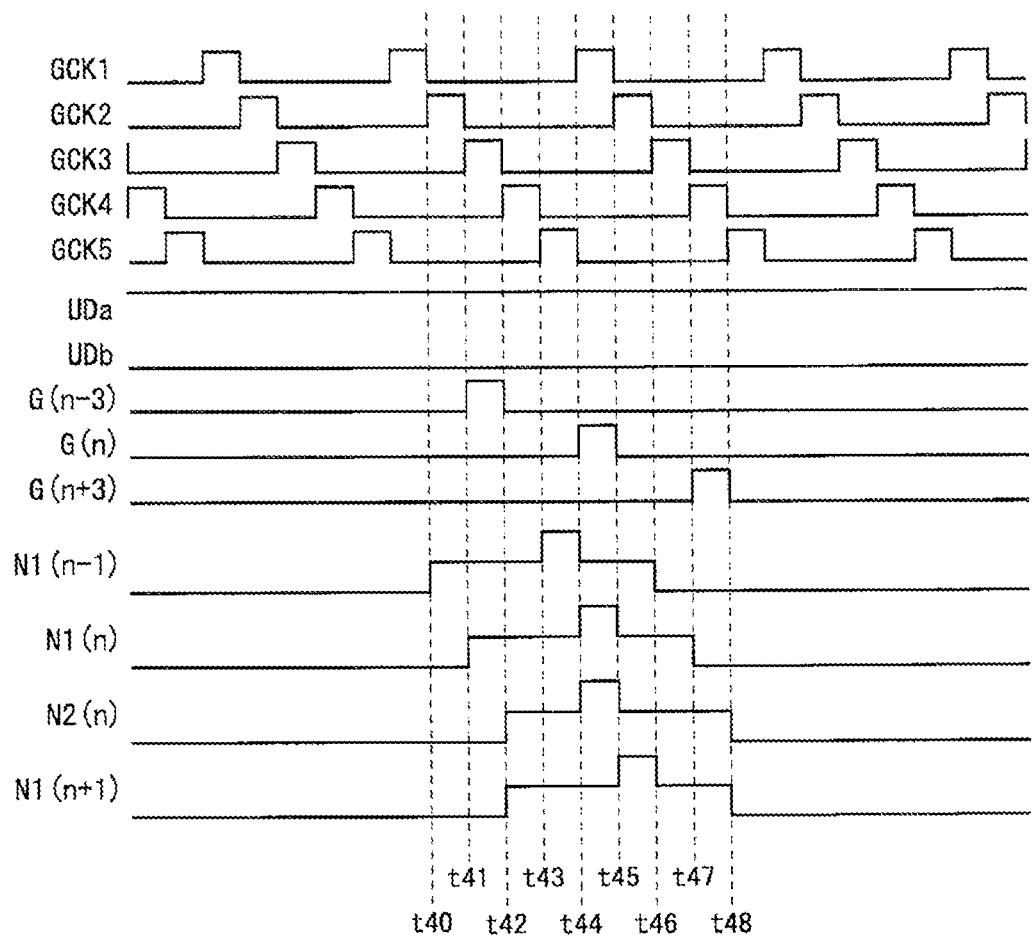
FIG. 15 is a signal waveform diagram for describing the operation of the gate driver when the forward scanning is performed according to a second modified example.

FIG. 15 is a signal waveform diagram for describing the operation of the gate driver when the forward scanning is performed. The voltage of the first state node N1(n) changes from the low level to the pre-charge voltage level at time t41 and then changes to the voltage level sufficiently higher than the normal high level at time t44. Then, for the period of 1H, the sufficiently high voltage level is maintained. That is, the voltage of the first state node N1(n) changes to the pre-charge voltage level at time t45. Thereafter, the voltage of the first state node N1(n) changes to the low level at time t47. Also, as with the voltage of the first state node N1(n), the voltage of the second state node N2(n) is maintained at the voltage level sufficiently higher than the normal high level during the period of 1H from time t44 to time t45. By generating the clock pulses of the first to fifth gate clock signals GCK1 to GCK5 as illustrated in FIG. 15, and giving the start pulse to the bistable circuits SR on the first stage side for the first shift register 411 and the second shift register 421, the high level (on level) scanning signal G is applied to the plurality of gate bus lines GL in ascending order.

Figure 16:
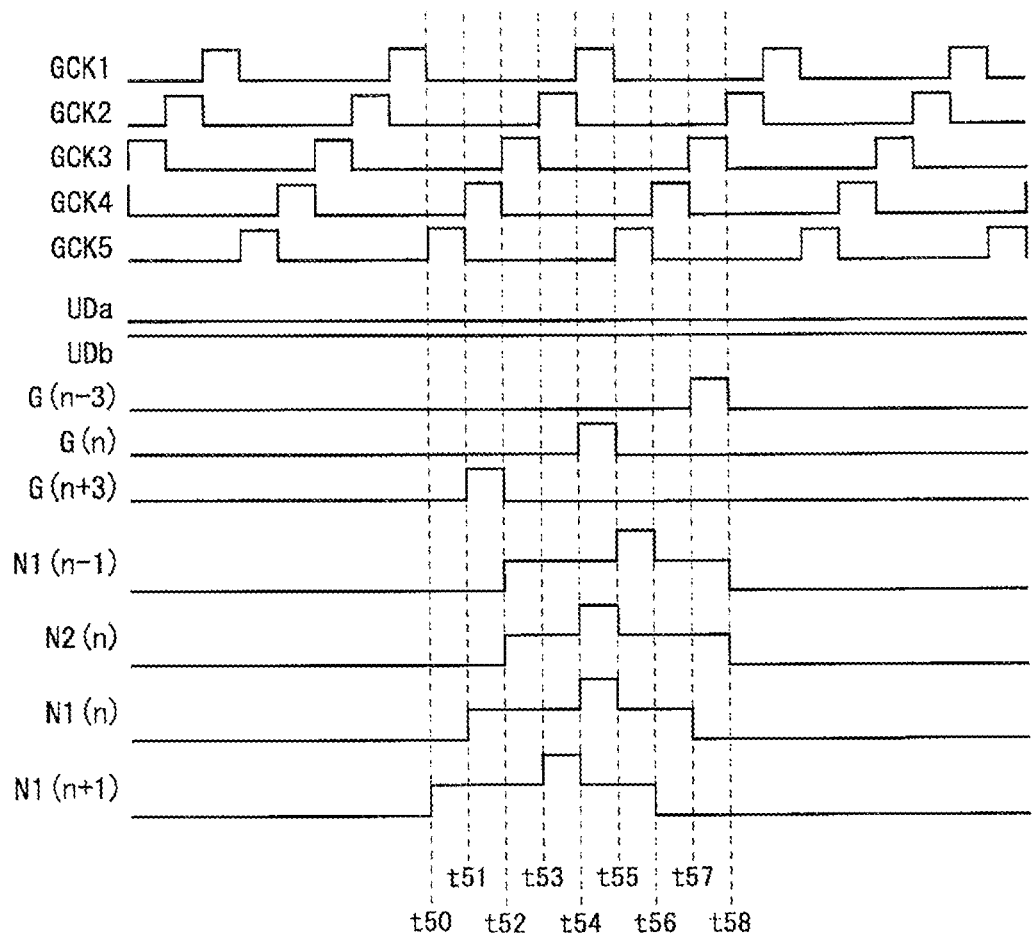
FIG. 16 is a signal waveform diagram for describing the operation of the gate driver when the reverse scanning is performed according to the second modified example.

FIG. 16 is a signal waveform diagram for describing the operation of the gate driver when the reverse scanning is performed. The voltage of the first state node N1(n) changes from the low level to the pre-charge voltage level at time t51 and then changes to the voltage level sufficiently higher than the normal high level at time t54. Then, for the period of 1H, the sufficiently high voltage level is maintained. That is, the voltage of the first state node N1(n) changes to the pre-charge voltage level at time t55. Thereafter, the voltage of the first state node N1(n) changes to the low level at time t57. Also, as with the voltage of the first state node N1(n), the voltage of the second state node N2(n) is maintained at the voltage level sufficiently higher than the normal high level during the period of 1H from time t54 to time t55. By generating the clock pulses of the first to fifth gate clock signals GCK1 to GCK5 as illustrated in FIG. 16, and giving the start pulse to the bistable circuits SR on the final stage side for the first shift register 411 and the second shift register 421, the high level (on level) scanning signal G is applied to the plurality of gate bus lines GL in descending order.

4.3 Third Modified Example

In the present modified example, the connection destinations of the input terminal 46 (the gate terminal of the thin film transistor Ta) and the input terminal 47 (the gate terminal of the thin film transistor Tb) of the bistable circuit SR are the same as those in the above embodiment (see FIG. 6). The number of phases of the multi-phase clock signal (gate clock signal GCK) used is five. Note that the number of phases of the multi-phase clock signal used may be six or more. The pulse width of each gate clock signal GCK is 2H.

Figure 17:
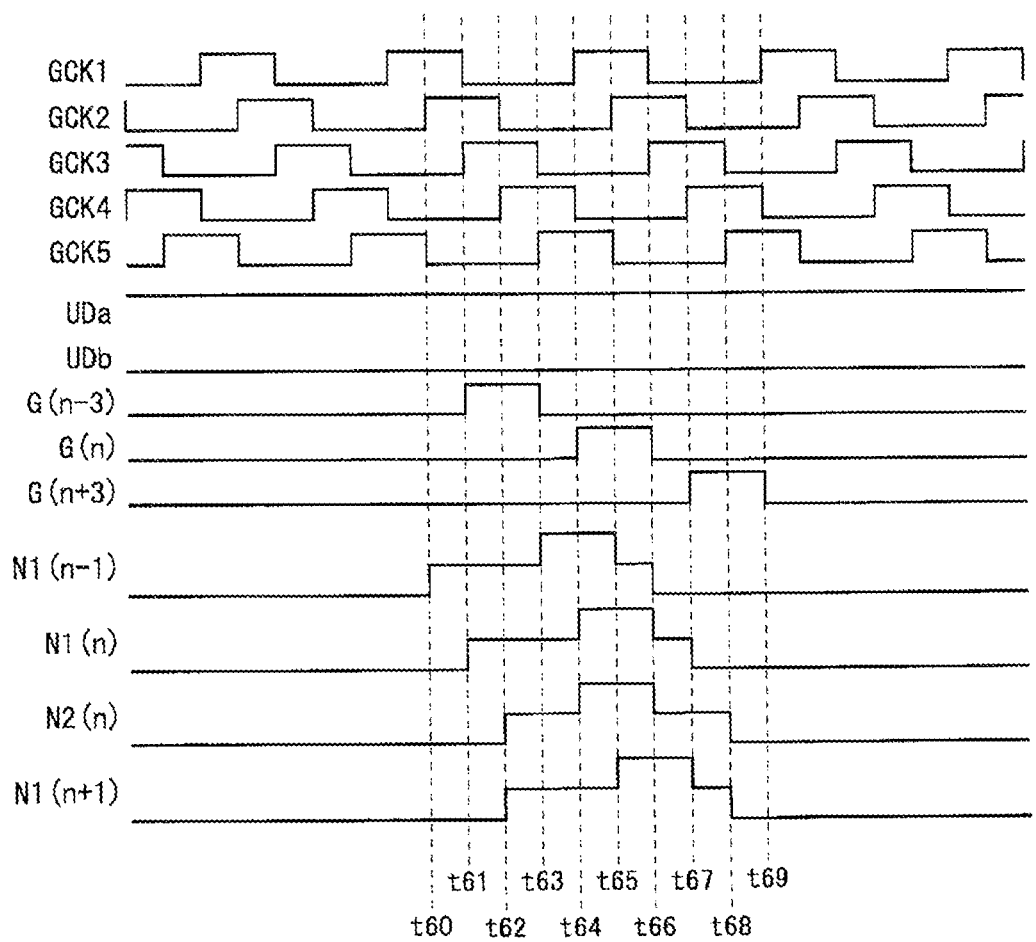
FIG. 17 is a signal waveform diagram for describing the operation of the gate driver when the forward scanning is performed according to a third modified example.

FIG. 17 is a signal waveform diagram for describing the operation of the gate driver when the forward scanning is performed. The voltage of the first state node N1(n) changes from the low level to the pre-charge voltage level at time t61 and then changes to the voltage level sufficiently higher than the normal high level at time t64. Then, for the period of 2H, the sufficiently high voltage level is maintained. That is, the voltage of the first state node N1(n) changes to the pre-charge voltage level at time t66. Thereafter, the voltage of the first state node N1(n) changes to the low level at time t67. Also, as with the voltage of the first state node N1(n), the voltage of the second state node N2(n) is maintained at the voltage level sufficiently higher than the normal high level during the period of 2H from time t64 to time t66. By generating the clock pulses of the first to fifth gate clock signals GCK1 to GCK5 as illustrated in FIG. 17, and giving the start pulse to the bistable circuits SR on the first stage side for the first shift register 411 and the second shift register 421, the high level (on level) scanning signal G is applied to the plurality of gate bus lines GL in ascending order.

Figure 18:
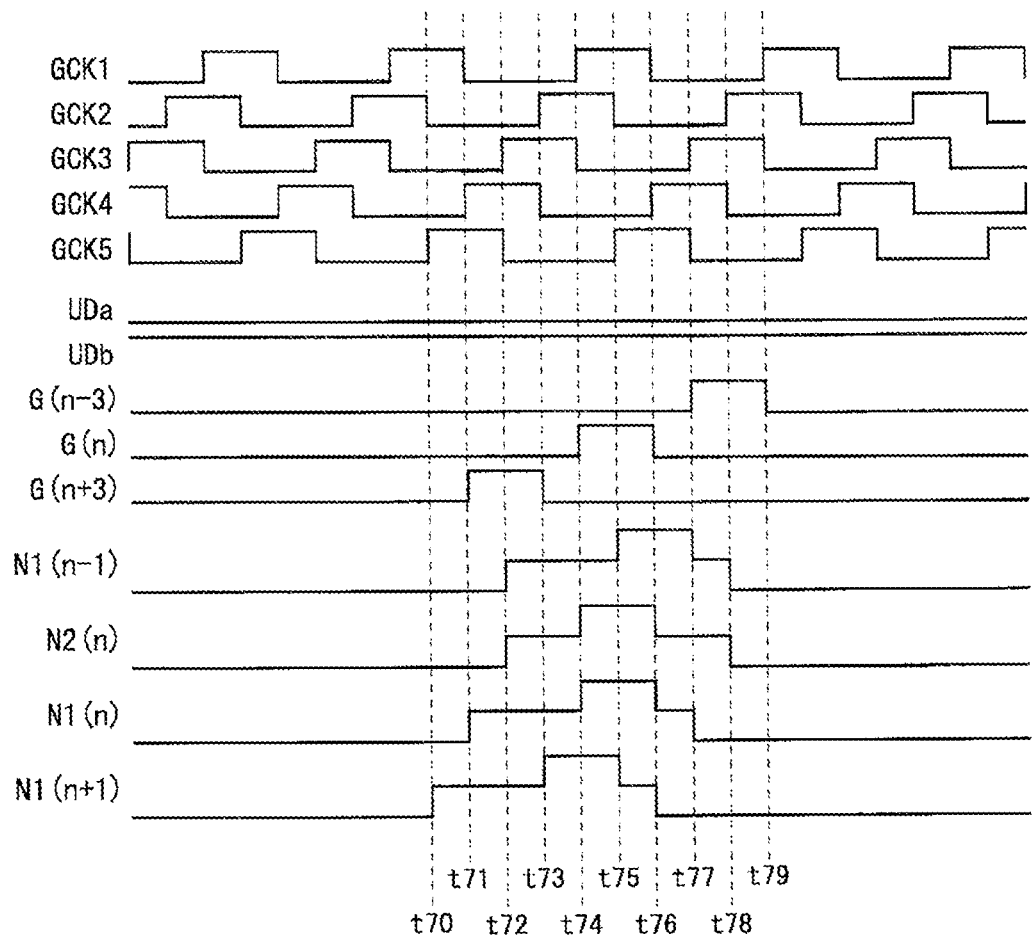
FIG. 18 is a signal waveform diagram for describing the operation of the gate driver when the reverse scanning is performed according to the third modified example.

FIG. 18 is a signal waveform diagram for describing the operation of the gate driver when the reverse scanning is performed. The voltage of the first state node N1(n) changes from the low level to the pre-charge voltage level at time t71 and then changes to the voltage level sufficiently higher than the normal high level at time t74. Then, for the period of 2H, the sufficiently high voltage level is maintained. That is, the voltage of the first state node N1(n) changes to the pre-charge voltage level at time t76. Thereafter, the voltage of the first state node N1(n) changes to the low level at time t77. Also, as with the voltage of the first state node N1(n), the voltage of the second state node N2(n) is maintained at the voltage level sufficiently higher than the normal high level during the period of 2H from time t74 to time t76. By generating the clock pulses of the first to fifth gate clock signals GCK1 to GCK5 as illustrated in FIG. 18, and giving the start pulse to the bistable circuits SR on the final stage side for the first shift register 411 and the second shift register 421, the high level (on level) scanning signal G is applied to the plurality of gate bus lines GL in descending order.

4.4 Fourth Modified Example

Figure 19:
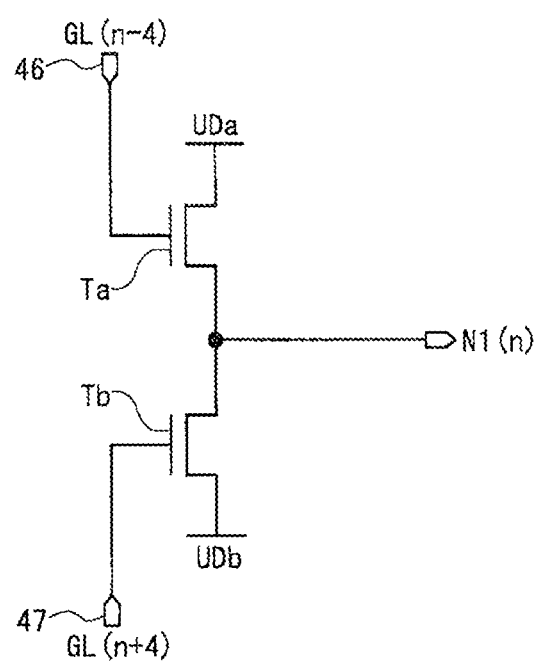
FIG. 19 is a circuit diagram illustrating a detailed configuration of a bistable circuit according to a fourth modified example.

FIG. 19 is a circuit diagram illustrating a detailed configuration of a bistable circuit SR(n) in the present modified example. The input terminal 46 (the gate terminal of the thin film transistor Ta) is connected to the gate bus line GL(n−4) on the (n−4)th line, and the input terminal 47 (the gate terminal of the thin film transistor Tb) is connected to the gate bus line GL(n+4) on the (n+4)th line. The number of phases of the multi-phase clock signal (gate clock signal GCK) used is six. Note that the number of phases of the multi-phase clock signal used may be seven or more. The pulse width of each gate clock signal GCK is 1H.

Figure 20:
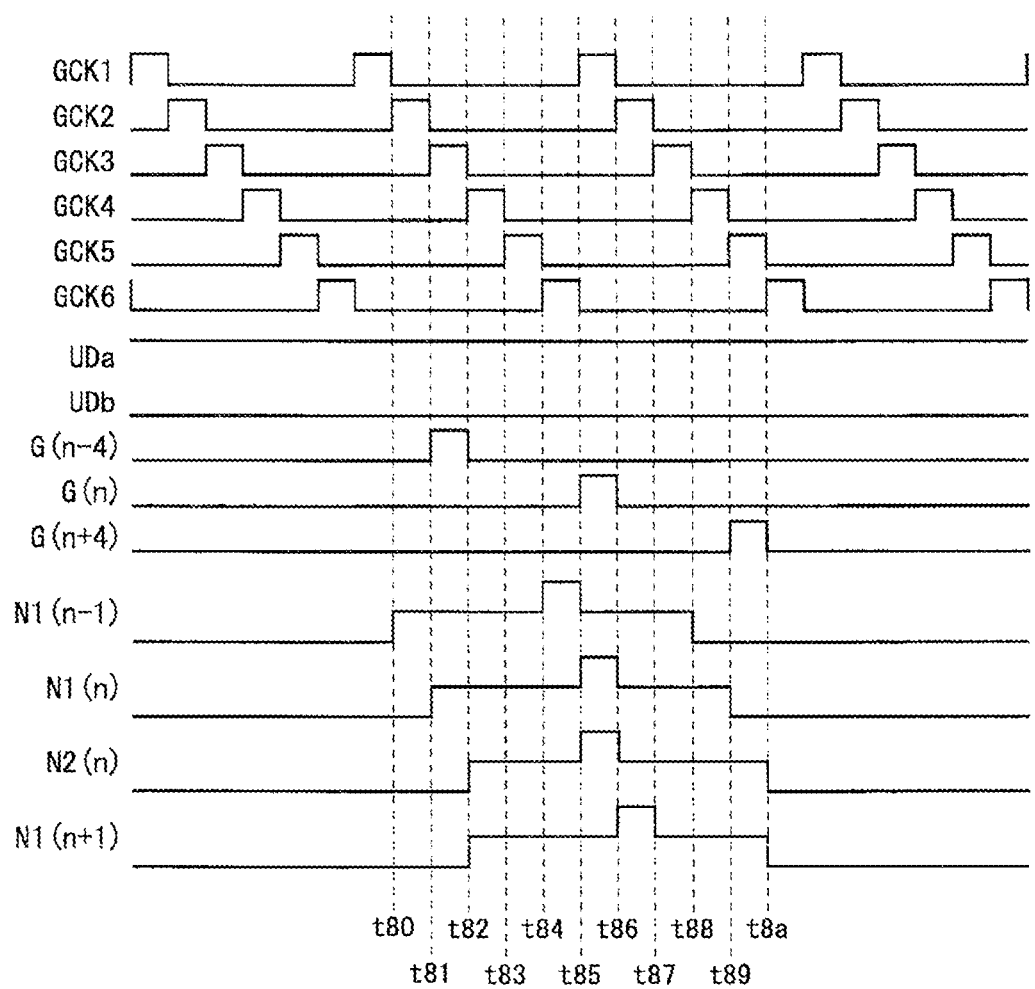
FIG. 20 is a signal waveform diagram for describing the operation of the gate driver when the forward scanning is performed according to the fourth modified example.

FIG. 20 is a signal waveform diagram for describing the operation of the gate driver when the forward scanning is performed. The voltage of the first state node N1(n) changes from the low level to the pre-charge voltage level at time t81 and then changes to the voltage level sufficiently higher than the normal high level at time t85. Then, for the period of 1H, the sufficiently high voltage level is maintained. That is, the voltage of the first state node N1(n) changes to the pre-charge voltage level at time t86. Thereafter, the voltage of the first state node N1(n) changes to the low level at time t89. Also, as with the voltage of the first state node N1(n), the voltage of the second state node N2(n) is maintained at the voltage level sufficiently higher than the normal high level during the period of 1H from time t85 to time t86. By generating the clock pulses of the first to sixth gate clock signals GCK1 to GCK6 as illustrated in FIG. 20, and giving the start pulse to the bistable circuits SR on the first stage side for the first shift register 411 and the second shift register 421, the high level (on level) scanning signal G is applied to the plurality of gate bus lines GL in ascending order.

Figure 21:
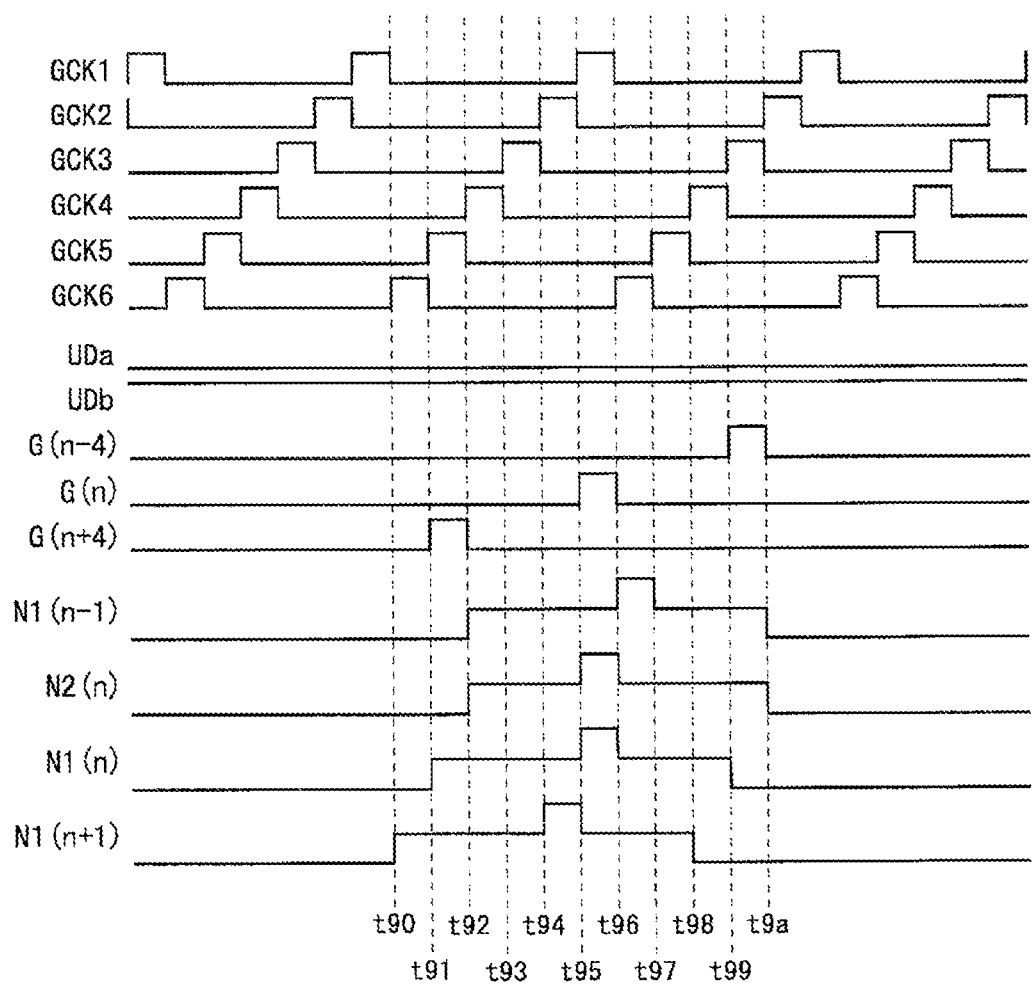
FIG. 21 is a signal waveform diagram for describing the operation of the gate driver when the reverse scanning is performed according to the fourth modified example.

FIG. 21 is a signal waveform diagram for describing the operation of the gate driver when the reverse scanning is performed. The voltage of the first state node N1(n) changes from the low level to the pre-charge voltage level at time t91 and then changes to the voltage level sufficiently higher than the normal high level at time t95. Then, for the period of 1H, the sufficiently high voltage level is maintained. That is, the voltage of the first state node N1(n) changes to the pre-charge voltage level at time t96. Thereafter, the voltage of the first state node N1(n) changes to the low level at time t99. Also, as with the voltage of the first state node N1(n), the voltage of the second state node N2(n) is maintained at the voltage level sufficiently higher than the normal high level during the period of 1H from time t95 to time t96. By generating the clock pulses of the first to sixth gate clock signals GCK1 to GCK6 as illustrated in FIG. 21, and giving the start pulse to the bistable circuits SR on the final stage side for the first shift register 411 and the second shift register 421, the high level (on level) scanning signal G is applied to the plurality of gate bus lines GL in descending order.

4.5 Fifth Modified Example

In the present modified example, the connection destinations of the input terminal 46 (the gate terminal of the thin film transistor Ta) and the input terminal 47 (the gate terminal of the thin film transistor Tb) of the bistable circuit SR are the same as those of the above-described fourth modified example (see FIG. 19). The number of phases of the multi-phase clock signal (gate clock signal GCK) used is six. Note that the number of phases of the multi-phase clock signal used may be seven or more. The pulse width of each gate clock signal GCK is 2H.

Figure 22:
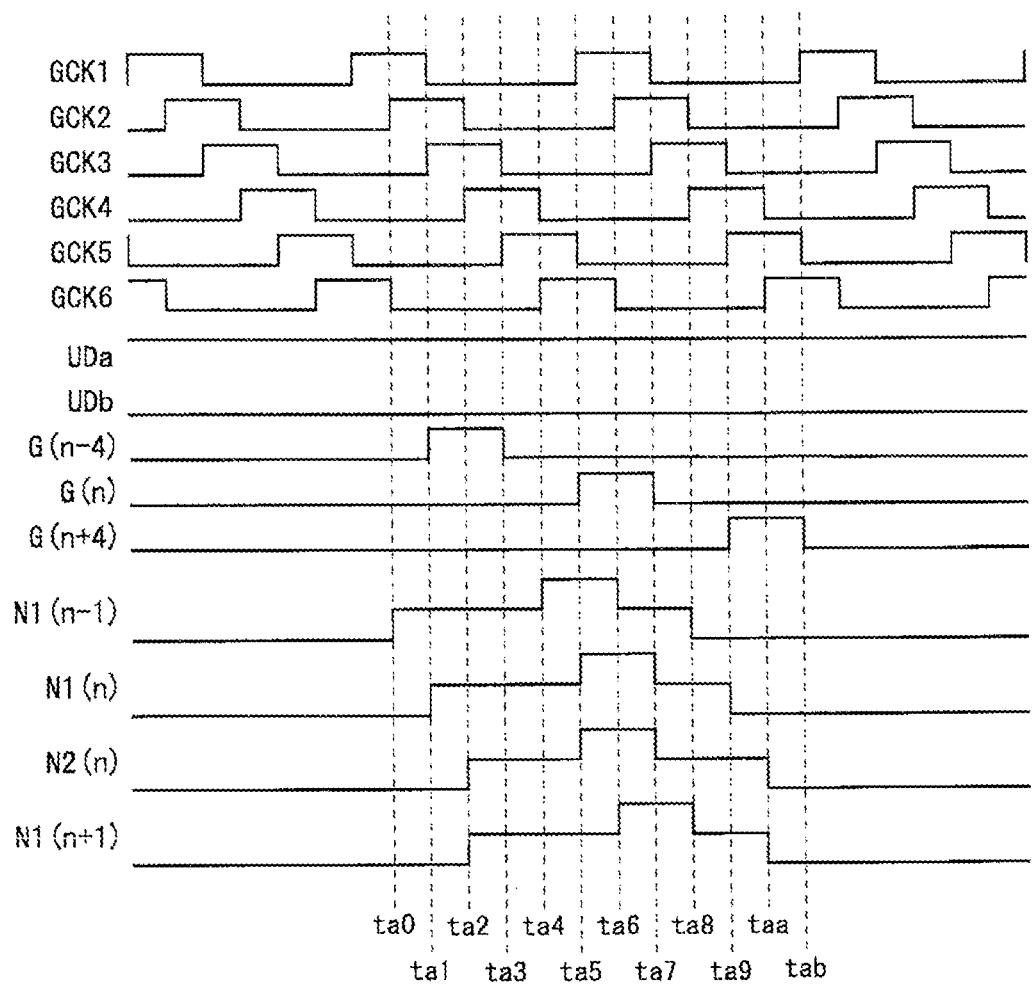
FIG. 22 is a signal waveform diagram for describing the operation of the gate driver when the forward scanning is performed according to a fifth modified example.

FIG. 22 is a signal waveform diagram for describing the operation of the gate driver when the forward scanning is performed. The voltage of the first state node N1(n) changes from the low level to the pre-charge voltage level at time ta1 and then changes to the voltage level sufficiently higher than the normal high level at time ta5. Then, for the period of 2H, the sufficiently high voltage level is maintained. That is, the voltage of the first state node N1(n) changes to the pre-charge voltage level at time ta7. Thereafter, the voltage of the first state node N1(n) changes to the low level at time tag. Also, as with the voltage of the first state node N1(n), the voltage of the second state node N2(n) is maintained at the voltage level sufficiently higher than the normal high level during the period of 2H from time ta5 to time ta7. By generating the clock pulses of the first to sixth gate clock signals GCK1 to GCK6 as illustrated in FIG. 22, and giving the start pulse to the bistable circuits SR on the first stage side for the first shift register 411 and the second shift register 421, the high level (on level) scanning signal G is applied to the plurality of gate bus lines GL in ascending order.

Figure 23:
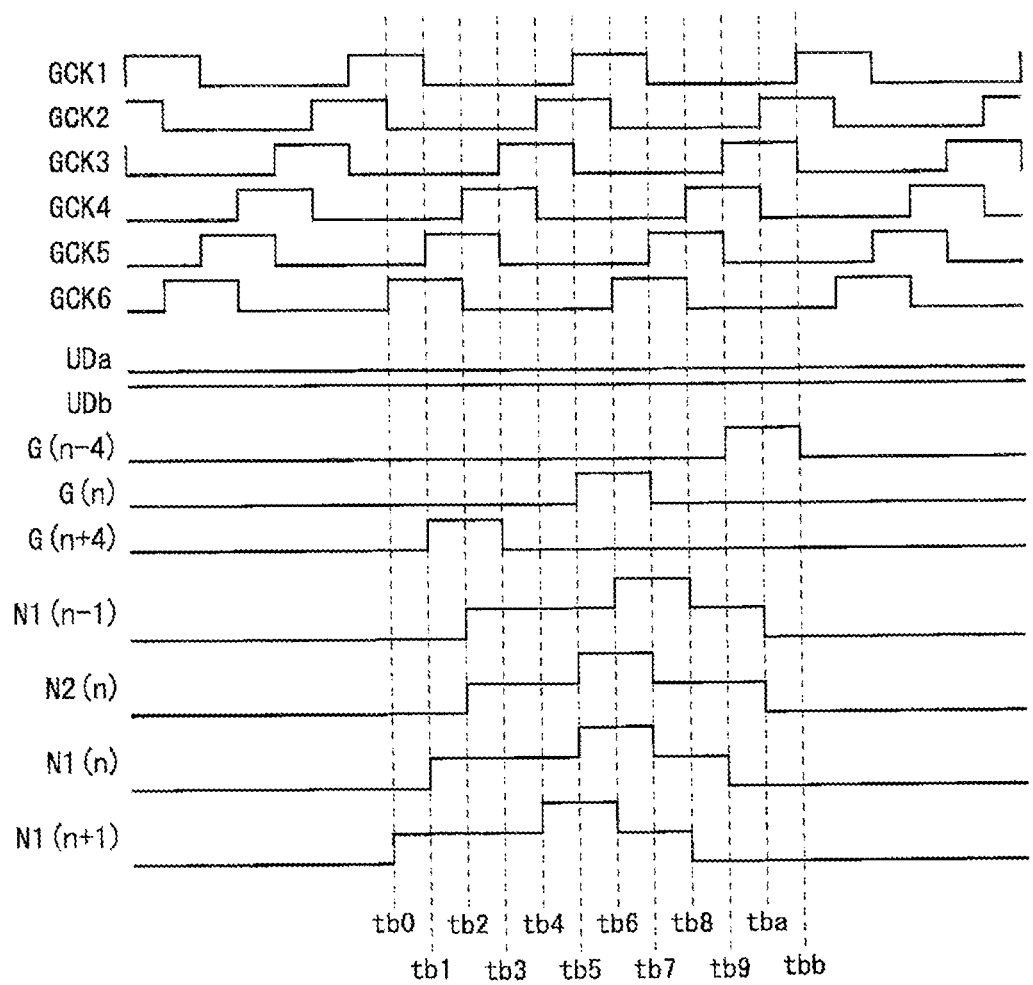
FIG. 23 is a signal waveform diagram for describing the operation of the gate driver when the reverse scanning is performed according to the fifth modified example.

FIG. 23 is a signal waveform diagram for describing the operation of the gate driver when the reverse scanning is performed. The voltage of the first state node N1(n) changes from the low level to the pre-charge voltage level at time tb1 and then changes to the voltage level sufficiently higher than the normal high level at time tb5. Then, for the period of 2H, the sufficiently high voltage level is maintained. That is, the voltage of the first state node N1(n) changes to the pre-charge voltage level at time tb7. Thereafter, the voltage of the first state node N1(n) changes to the low level at time tb9. Also, as with the voltage of the first state node N1(n), the voltage of the second state node N2(n) is maintained at the voltage level sufficiently higher than the normal high level during the period of 2H from time tb5 to time tb7. By generating the clock pulses of the first to sixth gate clock signals GCK1 to GCK6 as illustrated in FIG. 23, and giving the start pulse to the bistable circuits SR on the final stage side for the first shift register 411 and the second shift register 421, the high level (on level) scanning signal G is applied to the plurality of gate bus lines GL in descending order.

4.6 Sixth Modified Example

In the present modified example, the connection destinations of the input terminal 46 (the gate terminal of the thin film transistor Ta) and the input terminal 47 (the gate terminal of the thin film transistor Tb) of the bistable circuit SR are the same as those of the above-described fourth modified example (see FIG. 19). The number of phases of the multi-phase clock signal (gate clock signal GCK) used is six. Note that the number of phases of the multi-phase clock signal used may be seven or more. The pulse width of each gate clock signal GCK is 3H.

Figure 24:
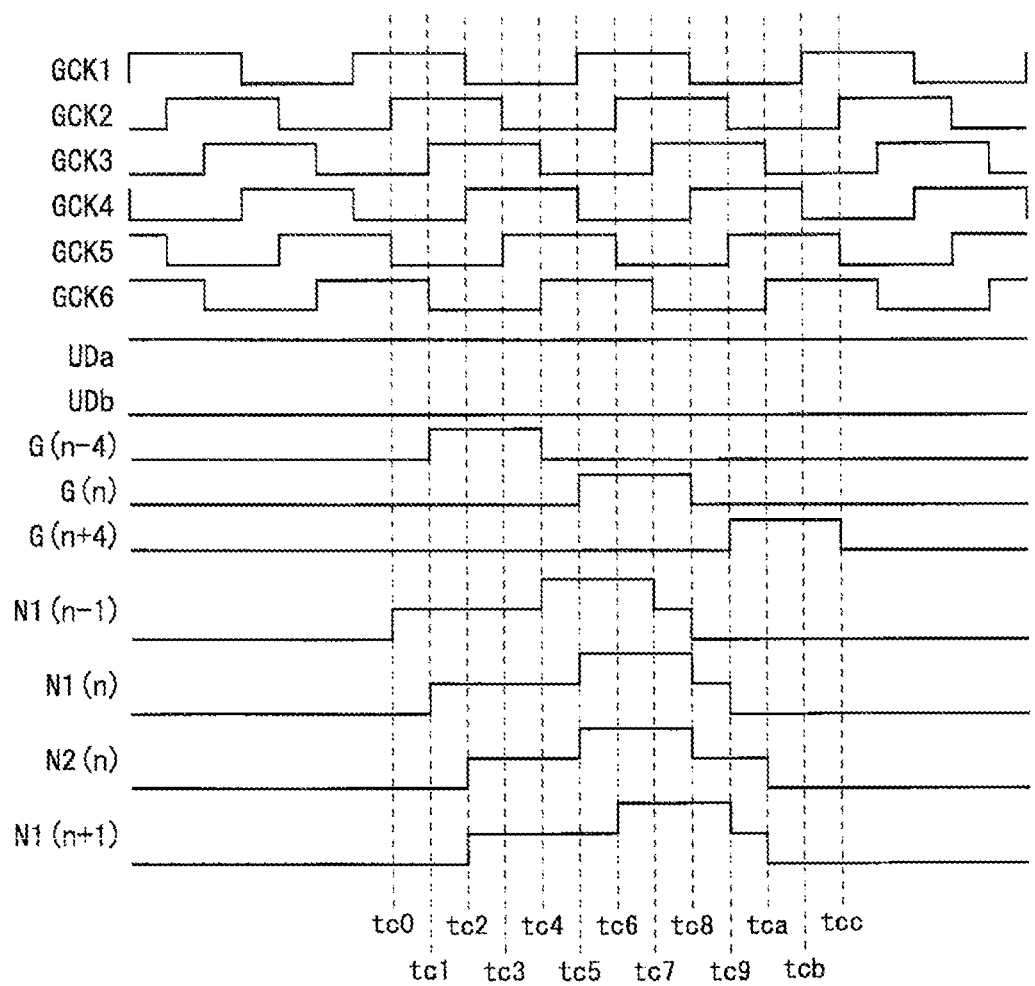
FIG. 24 is a signal waveform diagram for describing the operation of the gate driver when the forward scanning is performed according to a sixth modified example.

FIG. 24 is a signal waveform diagram for describing the operation of the gate driver when the forward scanning is performed. The voltage of the first state node N1(n) changes from the low level to the pre-charge voltage level at time tc1 and then changes to the voltage level sufficiently higher than the normal high level at time tc5. Then, for the period of 3H, the sufficiently high voltage level is maintained. That is, the voltage of the first state node N1(n) changes to the pre-charge voltage level at time tc8. Thereafter, the voltage of the first state node N1(n) changes to the low level at time tc9. Also, as with the voltage of the first state node N1(n), the voltage of the second state node N2(n) is maintained at the voltage level sufficiently higher than the normal high level during the period of 3H from time tc5 to time tc8. By generating the clock pulses of the first to sixth gate clock signals GCK1 to GCK6 as illustrated in FIG. 24, and giving the start pulse to the bistable circuits SR on the first stage side for the first shift register 411 and the second shift register 421, the high level (on level) scanning signal G is applied to the plurality of gate bus lines GL in ascending order.

Figure 25:
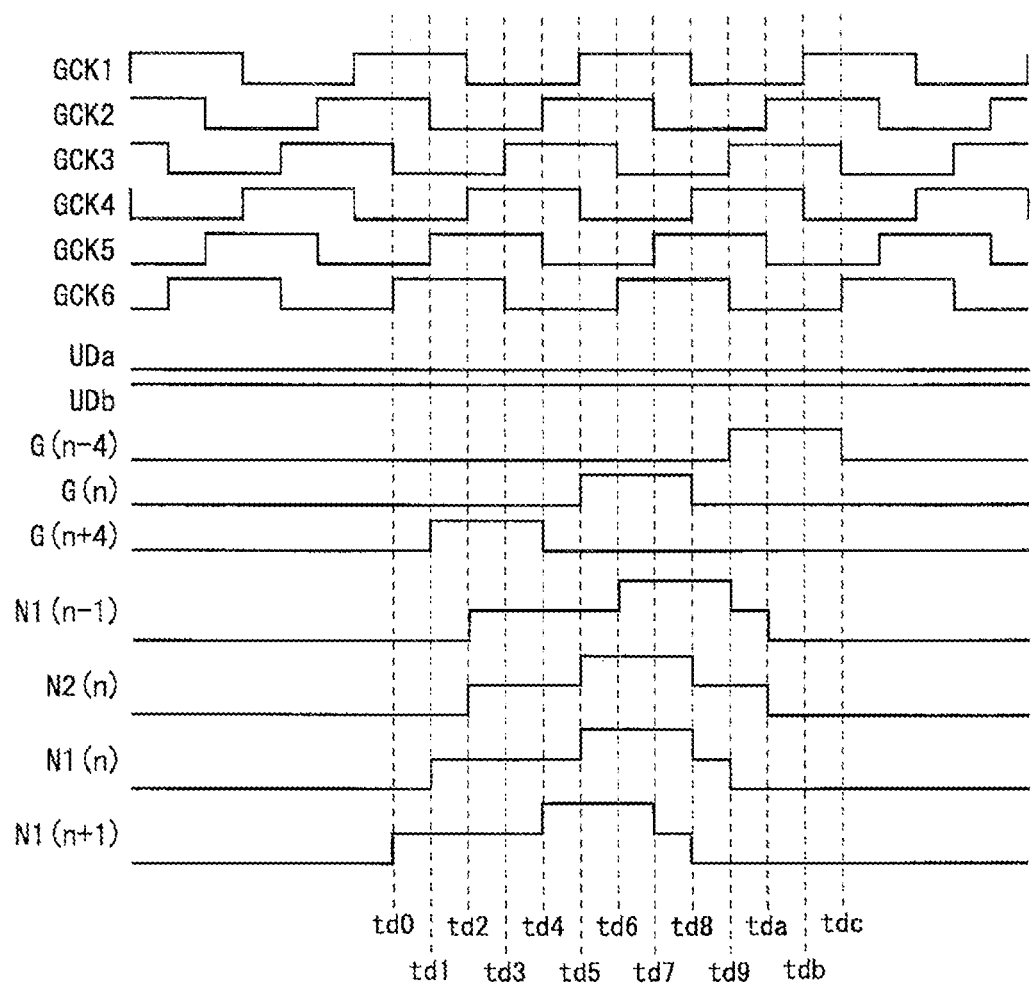
FIG. 25 is a signal waveform diagram for describing the operation of the gate driver when the reverse scanning is performed according to the sixth modified example.
Figure 26:
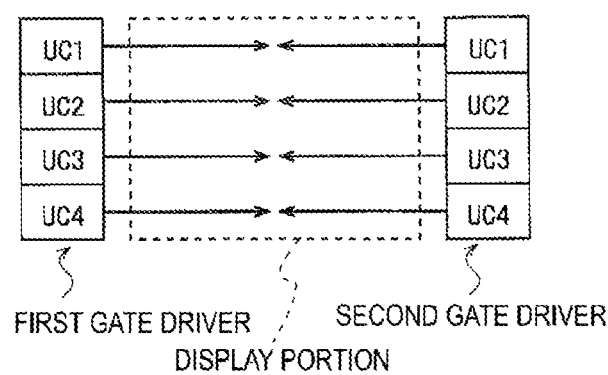
FIG. 26 is a diagram for describing a two-sided input method for a related example.
Figure 27:
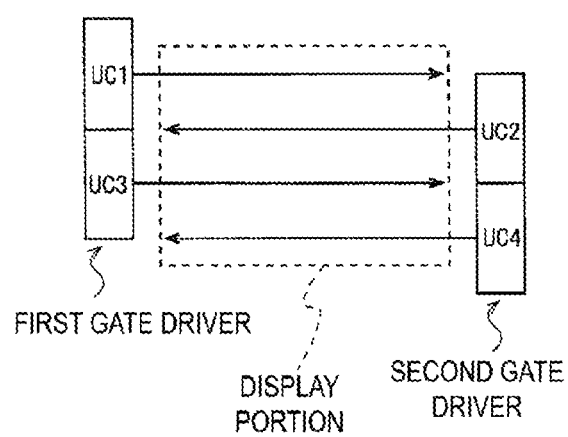
FIG. 27 is a diagram for describing a one-sided input method for the related example.
Figure 28:
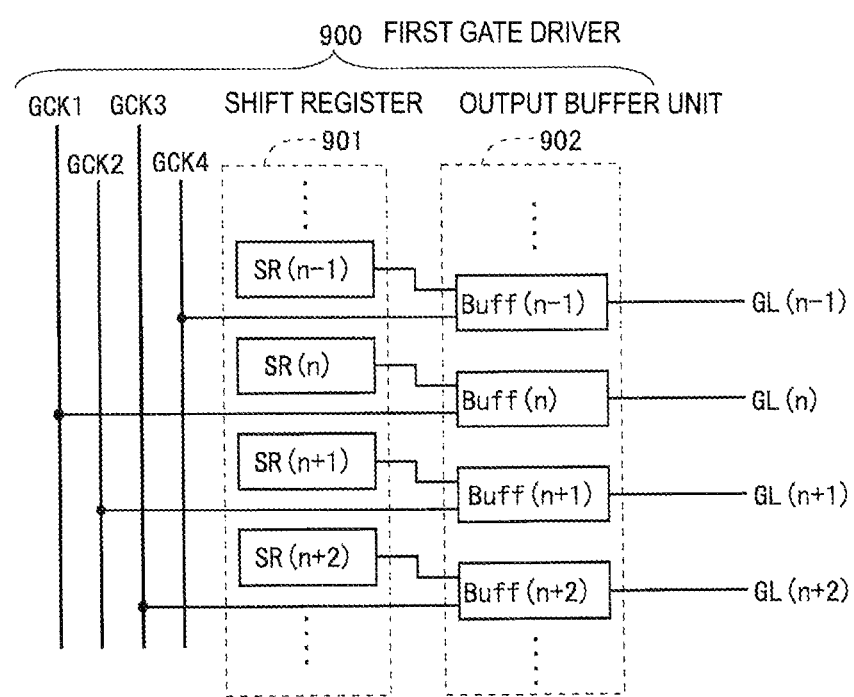
FIG. 28 is a schematic circuit diagram illustrating a configuration of a first gate driver in a case in which the two-sided input method is adopted for the related example.
Figure 29:
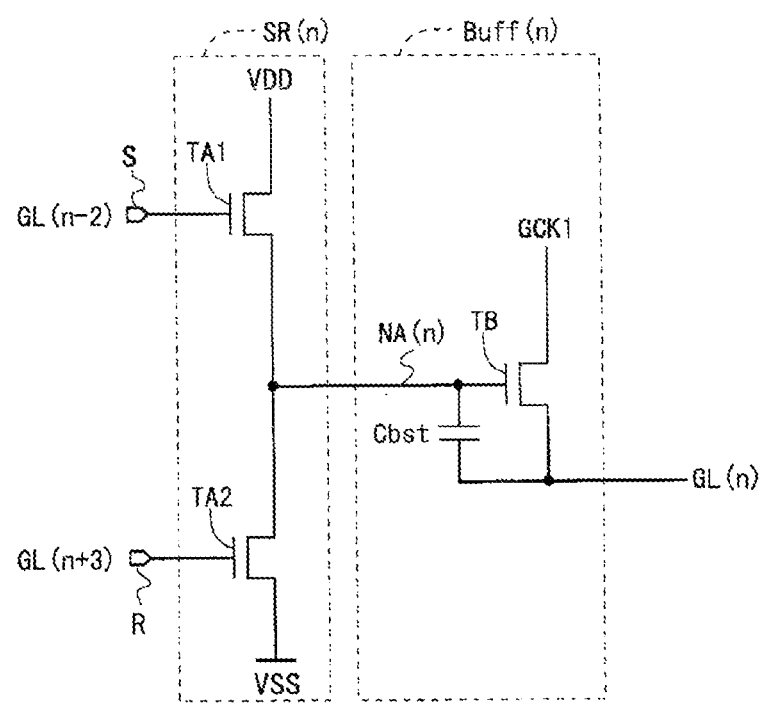
FIG. 29 is a circuit diagram illustrating a configuration of a circuit (unit circuit) corresponding to one gate bus line in a first gate driver for the related example.

FIG. 25 is a signal waveform diagram for describing the operation of the gate driver when the reverse scanning is performed. The voltage of the first state node N1(n) changes from the low level to the pre-charge voltage level at time td1 and then changes to the voltage level sufficiently higher than the normal high level at time td5. Then, for the period of 3H, the sufficiently high voltage level is maintained. That is, the voltage of the first state node N1(n) changes to the pre-charge voltage level at time td8. Thereafter, the voltage of the first state node N1(n) changes to the low level at time td9. Also, as with the voltage of the first state node N1(n), the voltage of the second state node N2(n) is maintained at the voltage level sufficiently higher than the normal high level during the period of 3H from time td5 to time td8. By generating the clock pulses of the first to sixth gate clock signals GCK1 to GCK6 as illustrated in FIG. 25, and giving the start pulse to the bistable circuits SR on the final stage side for the first shift register 411 and the second shift register 421, the high level (on level) scanning signal G is applied to the plurality of gate bus lines GL in descending order.

4.7 Summary

From the above embodiment and all the above modified examples, it is considered that, by generalizing, a configuration described below can be adopted with J and K as integers. A bistable circuit SR(K) corresponding to a gate bus line GL(K) on a Kth line includes a first state node N1(K) connected to a first buffer circuit Buf1(K) to which the output signal is outputted, and the two thin film transistors Ta and Tb having the source terminals connected to the first state node N1(K). For the thin film transistor Ta, the gate terminal is connected to a gate bus line GL(K−J) on a (K−J)th line, and the drain terminal is connected to the first shift direction control line UDa. For the thin film transistor Tb, the gate terminal is connected to a gate bus line GL(K+J) on a (K+J)th line, and the drain terminal is connected to the second shift direction control line UDb. The first shift direction control line UDa is given the high level power supply voltage VDD during the forward scanning and the low level power supply voltage VSS during the reverse scanning. The second shift direction control line UDb is given the low level power supply voltage VSS during the forward scanning and the high level power supply voltage VDD during the reverse scanning.

Incidentally, in each of the bistable circuits SR, a period of at least 1H for pre-charging the first state node N1 and a period of at least 1H for pre-charging the second state node N2 are required before the voltage of the first state node N1 is raised to the voltage sufficiently higher than the normal high level by the boost operation. Thus, J is an integer of two or more so that the pre-charging of the first state node N1 is started 2H or more before the timing at which the boost operation is performed.

Further, in the second buffer circuit Buf2, the voltage of the second state node N2 drops to the low level after (J+1)H from the timing at which the voltage becomes sufficiently higher than the normal high level by the boost operation. Here, the gate clock signal GCK given to the second buffer circuit Buf2 is to be maintained at the low level so as not to cause a malfunction until the voltage of the second state node N2 drops to the low level after changing from the high level to the low level after the boost operation. Accordingly, the number of phases of the multi-phase clock signal used as the gate clock signal GCK is (J+2) or more.

Further, in each of the bistable circuits SR, the thin film transistor Ta or the thin film transistor Tb is brought into the on state after JH from the timing in which the voltage of the first state node N1 is sufficiently higher than the normal high level by the boost operation. In this regard, a malfunction may occur in a case that the gate clock signal GCK given to the drain terminal of the thin film transistor T1 in the first buffer circuit Buf1 is at the high level, when the voltage of the first state node N1 is about to drop due to the thin film transistor Ta or the thin film transistor Tb being at the on state. Thus, the pulse width of the gate clock signal GCK is (J−1)H or less. Note that the minimum pulse width of the gate clock signal GCK is 1H.

5. Other

Although the disclosure has been described in detail above, the above description is exemplary in all respects and is not limiting. It is understood that numerous other modifications or variations can be made without departing from the scope of the disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A scanning signal line drive circuit configured to sequentially apply an on level scanning signal to a plurality of scanning signal lines arranged in a display portion of a display device, the scanning signal line drive circuit comprising:
    a first scanning signal line drive circuit arranged on one end side of the plurality of scanning signal lines and configured to operate based on a multi-phase clock signal;
    a second scanning signal line drive circuit arranged on another end side of the plurality of scanning signal lines and configured to operate based on the multi-phase clock signal;
    a first control line configured to supply a voltage corresponding to an on level in a case that the on level scanning signal is applied to the plurality of scanning signal lines in ascending order and supply a voltage corresponding to an off level in a case that the on level scanning signal is applied to the plurality of scanning signal lines in descending order; and
    a second control line configured to supply the voltage corresponding to the off level in a case that the on level scanning signal is applied to the plurality of scanning signal lines in ascending order and supply the voltage corresponding to the on level in a case that the on level scanning signal is applied to the plurality of scanning signal lines in descending order,
    wherein each of the first scanning signal line drive circuit and the second scanning signal line drive circuit includes
    a shift register including a plurality of bistable circuits cascade-connected to each other,
    a plurality of first buffer circuits having a one-to-one correspondence with the plurality of bistable circuits and connected to every other line of the plurality of scanning signal lines, respectively, and
    a plurality of second buffer circuits connected to the plurality of scanning signal lines not connected to the plurality of first buffer circuits, respectively,
    the plurality of bistable circuits constituting the shift register included in the first scanning signal line drive circuit have a one-to-one correspondence with the plurality of scanning signal lines on odd-numbered lines,
    each of the plurality of first buffer circuits included in the first scanning signal line drive circuit is connected to a corresponding scanning signal line on an odd-numbered line, each of the plurality of second buffer circuits included in the first scanning signal line drive circuit is connected to a corresponding scanning signal line on an even-numbered line, the plurality of bistable circuits constituting the shift register included in the second scanning signal line drive circuit have a one-to-one correspondence with the plurality of scanning signal lines on the even-numbered line, each of the plurality of first buffer circuits included in the second scanning signal line drive circuit is connected to the scanning signal line on the even-numbered line, each of the plurality of second buffer circuits included in the second scanning signal line drive circuit is connected to the scanning signal line on the odd-numbered line, each of the plurality of first buffer circuits applies the on level scanning signal to the scanning signal line to be connected, based on an output signal of a bistable circuit corresponding to the scanning signal line to be connected and a first clock signal to be supplied, each of the plurality of second buffer circuits applies the on level scanning signal to the scanning signal line to be connected, based on the output signal of a bistable circuit corresponding to one scanning signal line adjacent to the scanning signal line to be connected, the output signal of the bistable circuit corresponding to another scanning signal line adjacent to the scanning signal line to be connected, and a second clock signal to be supplied, with I as an integer, to a corresponding first buffer circuit connected to the scanning signal line on an Ith line, a corresponding second buffer circuit connected to the scanning signal line on an (I−1)th line, and a corresponding second buffer circuit connected to the scanning signal line on an (I+1)th line, an identical output signal of a corresponding bistable circuit is supplied and also clock signals having different phases from each other in the multi-phase clock signal are supplied, an identical clock signal in the multi-phase clock signal is supplied to the first buffer circuit and the second buffer circuit, connected to an identical scanning signal line, with J and K as integers, a corresponding bistable circuit corresponding to the scanning signal line on a Kth line includes a first-state node connected to the first buffer circuit to which the output signal is outputted, a first first-state node control transistor including a control terminal connected to the scanning signal line on a (K−J)th line or a control terminal to which a signal having a waveform having a phase identical with a scanning signal applied to the scanning signal line on the (K−J)th line is given, a first conduction terminal connected to the first control line, and a second conduction terminal connected to the first-state node, and a second first-state node control transistor including a control terminal connected to the scanning signal line on a (K+J)th line or a control terminal to which a signal having a waveform having a phase identical with a scanning signal applied to the scanning signal line on the (K+J)th line is given, a first conduction terminal connected to the second control line, and a second conduction terminal connected to the first-state node.

2. A display device including a display portion provided with a plurality of data signal lines, a plurality of scanning signal lines intersecting the plurality of data signal lines, and a plurality of pixel forming sections arranged in a matrix along the plurality of data signal lines and the plurality of scanning signal lines, the display device comprising:
- a data signal line drive circuit configured to drive the plurality of data signal lines;
- the scanning signal line drive circuit according to claim 1; and
- a display control circuit configured to control the data signal line drive circuit and the scanning signal line drive circuit.

3. The display device according to claim 2, wherein the scanning signal line drive circuit and the display portion are integrally formed on an identical substrate.

4. The scanning signal line drive circuit according to claim 1,
wherein J is an integer of two or more,
a number of phases of the multi-phase clock signal is (J+2) or more, and
a pulse width of the multi-phase clock signal corresponds to a length of one horizontal scanning period or more and (J−1) horizontal scanning period or less.

5. A display device including a display portion provided with a plurality of data signal lines, a plurality of scanning signal lines intersecting the plurality of data signal lines, and a plurality of pixel forming sections arranged in a matrix along the plurality of data signal lines and the plurality of scanning signal lines, the display device comprising:
- a data signal line drive circuit configured to drive the plurality of data signal lines;
- the scanning signal line drive circuit according to claim 4; and
- a display control circuit configured to control the data signal line drive circuit and the scanning signal line drive circuit.

6. The display device according to claim 5, wherein the scanning signal line drive circuit and the display portion are integrally formed on an identical substrate.

7. The scanning signal line drive circuit according to claim 1,
wherein each of the plurality of first buffer circuits includes
a first buffer transistor including a control terminal connected to the first-state node included in the corresponding bistable circuit, a first conduction terminal to which a corresponding clock signal is given, and a second conduction terminal connected to the corresponding scanning signal line, and
a first capacitor whose one end is connected to the control terminal of the first buffer transistor and another end is connected to the second conduction terminal of the first buffer transistor.

8. A display device including a display portion provided with a plurality of data signal lines, a plurality of scanning signal lines intersecting the plurality of data signal lines, and a plurality of pixel forming sections arranged in a matrix along the plurality of data signal lines and the plurality of scanning signal lines, the display device comprising:
- a data signal line drive circuit configured to drive the plurality of data signal lines;
- the scanning signal line drive circuit according to claim 7; and
- a display control circuit configured to control the data signal line drive circuit and the scanning signal line drive circuit.

9. The display device according to claim 8, wherein the scanning signal line drive circuit and the display portion are integrally formed on an identical substrate.

10. The scanning signal line drive circuit according to claim 1,
wherein each of the plurality of second buffer circuits includes
a second-state node,
a second buffer transistor including a control terminal connected to the second-state node, a first conduction terminal to which a corresponding clock signal is given, and a second conduction terminal connected to the corresponding scanning signal line,
a first control transistor including a control terminal connected to the second control line, a first conduction terminal connected to the first-state node included in the bistable circuit corresponding to the one scanning signal line adjacent to the scanning signal line to be connected, and a second conduction terminal connected to the second-state node,
a second control transistor including a control terminal connected to the first control line, a first conduction terminal connected to the first-state node included in the bistable circuit corresponding to another scanning signal line adjacent to the scanning signal line to be connected, and a second conduction terminal connected to the second-state node, and
a second capacitor whose one end is connected to the control terminal of the second buffer transistor and another end is connected to the second conduction terminal of the second buffer transistor.

11. A display device including a display portion provided with a plurality of data signal lines, a plurality of scanning signal lines intersecting the plurality of data signal lines, and a plurality of pixel forming sections arranged in a matrix along the plurality of data signal lines and the plurality of scanning signal lines, the display device comprising:
a data signal line drive circuit configured to drive the plurality of data signal lines;
the scanning signal line drive circuit according to claim 10; and
a display control circuit configured to control the data signal line drive circuit and the scanning signal line drive circuit.

12. The display device according to claim 11, wherein the scanning signal line drive circuit and the display portion are integrally formed on an identical substrate.

13. The scanning signal line drive circuit according to claim 1,
wherein each of the plurality of first buffer circuits includes
a first buffer transistor including a control terminal connected to the first-state node included in the corresponding bistable circuit, a first conduction terminal to which a corresponding clock signal is given, and a second conduction terminal connected to the corresponding scanning signal line, and
a first capacitor whose one end is connected to the control terminal of the first buffer transistor and another end is connected to the second conduction terminal of the first buffer transistor,
each of the plurality of second buffer circuits includes
a second-state node,
a second buffer transistor including a control terminal connected to the second-state node, a first conduction terminal to which the corresponding clock signal is given, and a second conduction terminal connected to the corresponding scanning signal line,
a first control transistor including a control terminal connected to the second control line, a first conduction terminal connected to the first-state node included in the bistable circuit corresponding to the one scanning signal line adjacent to the scanning signal line to be connected, and a second conduction terminal connected to the second-state node,
a second control transistor including a control terminal connected to the first control line, a first conduction terminal connected to the first-state node included in a bistable circuit corresponding to another scanning signal line adjacent to the scanning signal line to be connected, and a second conduction terminal connected to the second-state node, and
a second capacitor whose one end is connected to the control terminal of the second buffer transistor and another end is connected to the second conduction terminal of the second buffer transistor, and
sizes for the first buffer transistor and the second buffer transistor, which are different from each other, and capacitance values for the first capacitor and the second capacitor, which are different from each other, are configured to make a drive capability of the scanning signal line by the first buffer circuit be about identical with a drive capability of the scanning signal line by the second buffer circuit.

14. A display device including a display portion provided with a plurality of data signal lines, a plurality of scanning signal lines intersecting the plurality of data signal lines, and a plurality of pixel forming sections arranged in a matrix along the plurality of data signal lines and the plurality of scanning signal lines, the display device comprising:
a data signal line drive circuit configured to drive the plurality of data signal lines;
the scanning signal line drive circuit according to claim 13; and
a display control circuit configured to control the data signal line drive circuit and the scanning signal line drive circuit.

15. The display device according to claim 14, wherein the scanning signal line drive circuit and the display portion are integrally formed on an identical substrate.

16. A driving method of a plurality of scanning signal lines arranged in a display portion of a display device,
wherein the display device includes
a first scanning signal line drive circuit arranged on one end side of the plurality of scanning signal lines and configured to operate based on a multi-phase clock signal;
a second scanning signal line drive circuit arranged on another end side of the plurality of scanning signal lines and configured to operate based on the multi-phase clock signal;
a first control line configured to supply a voltage corresponding to an on level in a case that an on level scanning signal is applied to the plurality of scanning signal lines in ascending order and supply a voltage corresponding to an off level in a case that the on level scanning signal is applied to the plurality of scanning signal lines in descending order; and
a second control line configured to supply the voltage corresponding to the off level in a case that the on level scanning signal is applied to the plurality of scanning signal lines in ascending order and supply the voltage corresponding to the on level in a case that the on level scanning signal is applied to the plurality of scanning signal lines in descending order,
each of the first scanning signal line drive circuit and the second scanning signal line drive circuit includes a shift register including a plurality of bistable circuits cascade-connected to each other, a plurality of first buffer circuits having a one-to-one correspondence with the plurality of bistable circuits and connected to every other line of the plurality of scanning signal lines, respectively, and a plurality of second buffer circuits connected to the plurality of scanning signal lines not connected to the plurality of first buffer circuits, respectively, the plurality of bistable circuits constituting the shift register included in the first scanning signal line drive circuit have a one-to-one correspondence with the plurality of scanning signal lines on odd-numbered lines, each of the plurality of first buffer circuits included in the first scanning signal line drive circuit is connected to a corresponding scanning signal line on an odd-numbered line, each of the plurality of second buffer circuits included in the first scanning signal line drive circuit is connected to a corresponding scanning signal line on an even-numbered line, the plurality of bistable circuits constituting the shift register included in the second scanning signal line drive circuit have a one-to-one correspondence with the plurality of scanning signal lines on the even-numbered line, each of the plurality of first buffer circuits included in the second scanning signal line drive circuit is connected to the scanning signal line on the even-numbered line, each of the plurality of second buffer circuits included in the second scanning signal line drive circuit is connected to the scanning signal line on the odd-numbered line, each of the plurality of first buffer circuits applies the on level scanning signal to the scanning signal line to be connected, based on an output signal of a bistable circuit corresponding to the scanning signal line to be connected and a first clock signal to be supplied, each of the plurality of second buffer circuits applies the on level scanning signal to the scanning signal line to be connected, based on the output signal of a bistable circuit corresponding to one scanning signal line adjacent to the scanning signal line to be connected, the output signal of the bistable circuit corresponding to another scanning signal line adjacent to the scanning signal line to be connected, and a second clock signal to be supplied, with I as an integer, to a corresponding first buffer circuit connected to the scanning signal line on an Ith line, a corresponding second buffer circuit connected to the scanning signal line on an (I−1)th line, and a corresponding second buffer circuit connected to the scanning signal line on an (I+1)th line, an identical output signal of a corresponding bistable circuit is supplied and also clock signals having different phases from each other in the multi-phase clock signal are supplied, an identical clock signal in the multi-phase clock signal is supplied to the first buffer circuit and the second buffer circuit, connected to an identical scanning signal line, with J and K as integers, a corresponding bistable circuit corresponding to the scanning signal line on a Kth line includes a first-state node connected to the first buffer circuit to which the output signal is outputted, a first first-state node control transistor including a control terminal connected to the scanning signal line on a (K−J)th line or a control terminal to which a signal having a waveform having a phase identical with a scanning signal applied to the scanning signal line on the (K−J)th line is given, a first conduction terminal connected to the first control line, and a second conduction terminal connected to the first-state node, and a second first-state node control transistor including a control terminal connected to the scanning signal line on a (K+J)th line or a control terminal to which a signal having a waveform having a phase identical with a scanning signal applied to the scanning signal line on the (K+J)th line is given, a first conduction terminal connected to the second control line, and a second conduction terminal connected to the first-state node, in a case that the on level scanning signal is applied to the plurality of scanning signal lines in ascending order, a start pulse is given to a corresponding bistable circuit on a first stage side of the shift register, in a case that the on level scanning signal is applied to the plurality of scanning signal lines in descending order, the start pulse is given to a corresponding bistable circuit on a final stage side of the shift register, and for the multi-phase clock signal, a clock pulse generation order in a case that the on level scanning signal is applied to the plurality of scanning signal lines in ascending order is reversed to the clock pulse generation order in a case that the on level scanning signal is applied to the plurality of scanning signal lines in descending order, the driving method comprising:

a first first-state node control transistor turn on step in which the first first-state node control transistor is changed from an off state to an on state;

a first first-state node control transistor turn-off step in which the first first-state node control transistor is changed from the on state to the off state;

a second first-state node control transistor turn-on step in which the second first-state node control transistor is changed from the off state to the on state; and a second first-state node control transistor turn-off step in which the second first-state node control transistor is changed from the on state to the off state, wherein in a case that the on level scanning signal is applied to the plurality of scanning signal lines in ascending order, processing is performed in order of the first first-state node control transistor turn-on step, the first first-state node control transistor turn-off step, the second first-state node control transistor turn-on step, and the second first-state node control transistor turn-off step, and in a case that the on level scanning signal is applied to the plurality of scanning signal lines in descending order, processing is performed in order of the second first-state node control transistor turn-on step, the second first-state node control transistor turn-off step, the first first-state node control transistor turn-on step, and the first first-state node control transistor turn-off step.

* * * * *